United States Patent
Matranga et al.

(10) Patent No.: US 11,495,310 B2
(45) Date of Patent: Nov. 8, 2022

(54) METHODS AND DEVICES FOR ERASING NON-VOLATILE MEMORY

(71) Applicant: STMicroelectronics S.r.l., Agrate Brianza (IT)

(72) Inventors: Giovanni Matranga, Catania (IT); Gianbattista Lo Giudice, Pedara (IT); Rosario Roberto Grasso, S. Agata Li Battiati (IT); Alberto Jose' Di Martino, Palagonia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/508,775

(22) Filed: Oct. 22, 2021

(65) Prior Publication Data
US 2022/0044743 A1    Feb. 10, 2022

Related U.S. Application Data

(63) Continuation of application No. 16/925,059, filed on Jul. 9, 2020, now Pat. No. 11,183,255.

(51) Int. Cl.
*G11C 16/34* (2006.01)
*G11C 16/30* (2006.01)
*G11C 16/14* (2006.01)

(52) U.S. Cl.
CPC ............ *G11C 16/344* (2013.01); *G11C 16/14* (2013.01); *G11C 16/30* (2013.01); *G11C 16/3404* (2013.01)

(58) Field of Classification Search
CPC ... G11C 16/3404; G11C 16/344; G11C 16/14; G11C 16/30
See application file for complete search history.

(56) References Cited

U.S. PATENT DOCUMENTS

| | | | |
|---|---|---|---|
| 6,438,037 B1 | 8/2002 | Fastow et al. | |
| 7,236,405 B2 | 6/2007 | Ueda | |
| 8,345,485 B2 | 1/2013 | Choy et al. | |
| 8,830,756 B2 | 9/2014 | Mu et al. | |
| 8,947,958 B2 | 2/2015 | Mu et al. | |
| 9,818,486 B2 | 11/2017 | Ziperovich | |
| 10,008,272 B2 | 6/2018 | Kang et al. | |
| 10,482,986 B2 * | 11/2019 | Cheng | G11C 16/3495 |
| 2013/0176784 A1 | 7/2013 | Cometti et al. | |
| 2014/0104950 A1 | 4/2014 | Yano | |

FOREIGN PATENT DOCUMENTS

TW    I511139 B    12/2015

\* cited by examiner

*Primary Examiner* — Son L Mai
(74) *Attorney, Agent, or Firm* — Slater Matsil, LLP

(57) ABSTRACT

A method for erasing non-volatile memory including applying a first voltage pulse to a non-volatile memory cell to perform a first erase operation of the non-volatile memory cell and determining that a threshold voltage of the non-volatile memory cell is greater than a test voltage. The method further comprising updating a dedicated memory location with a value; and checking the non-volatile memory cell to determine whether the threshold voltage of the non-volatile memory cell is less than an erase-verify voltage to verify that the first erase operation has been performed successfully.

20 Claims, 18 Drawing Sheets

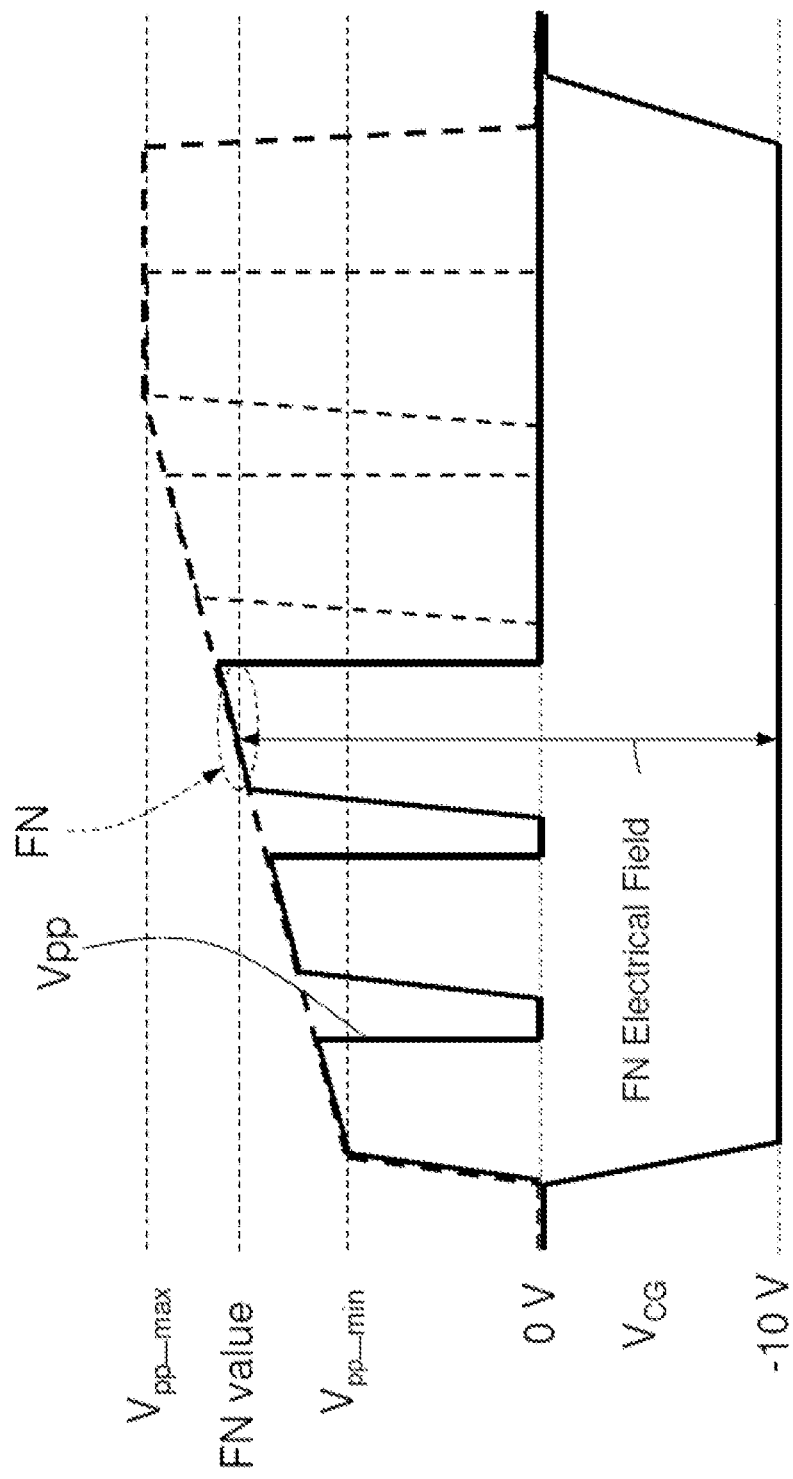

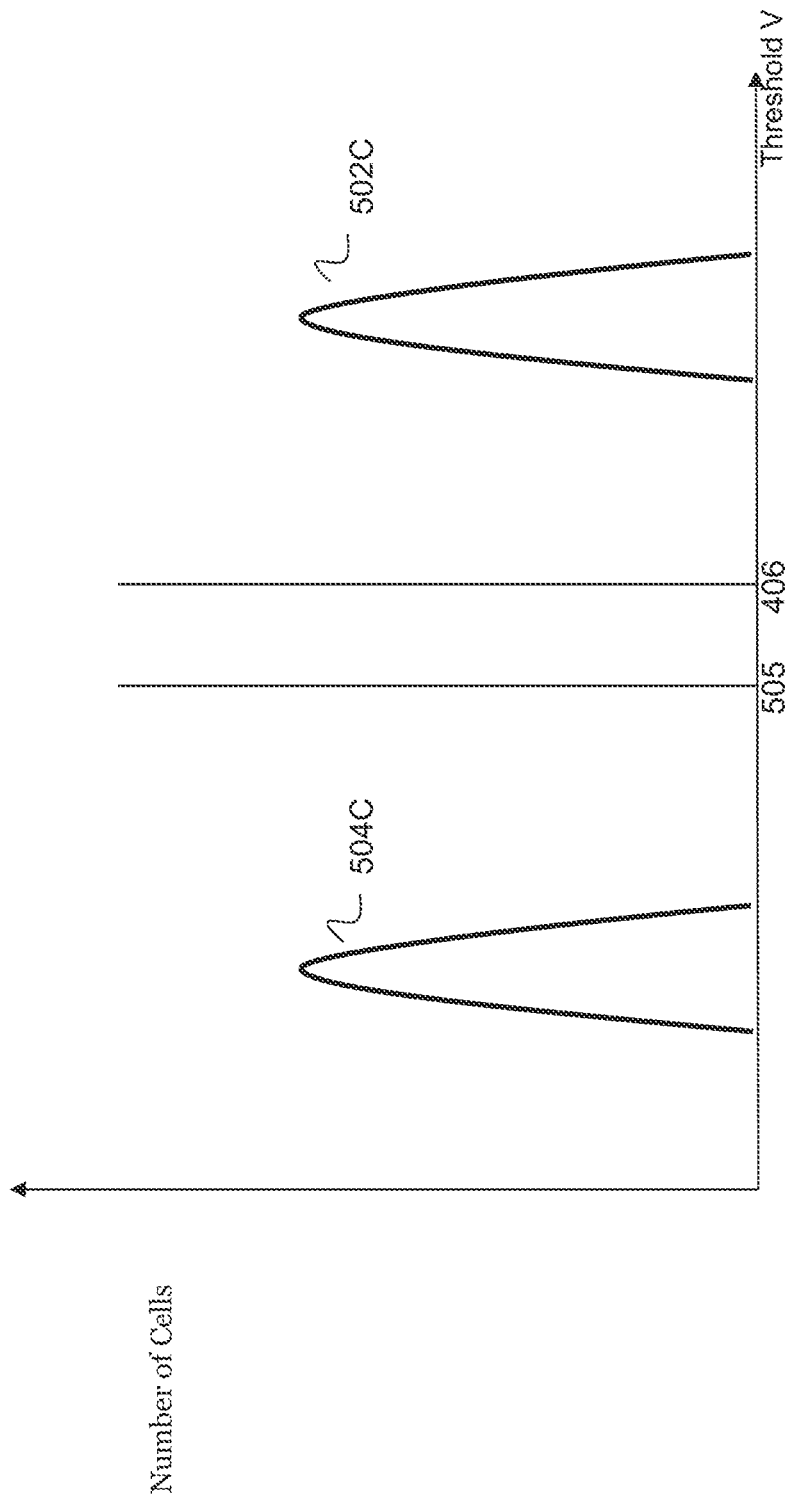

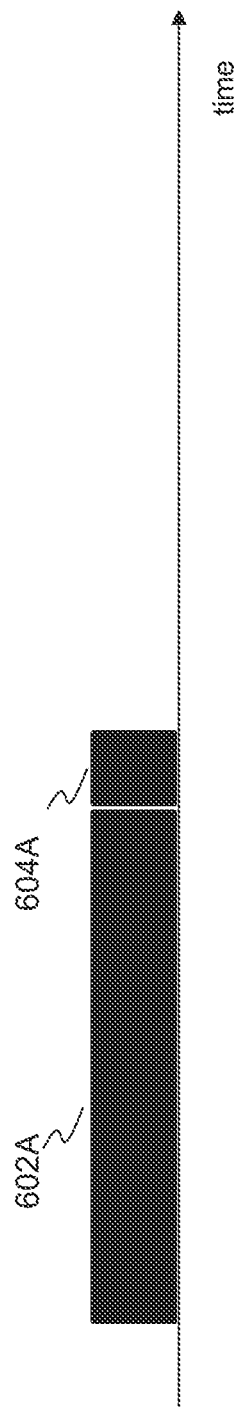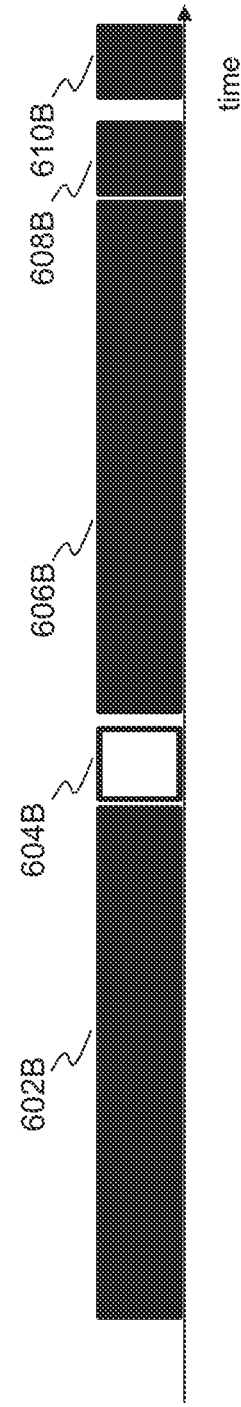

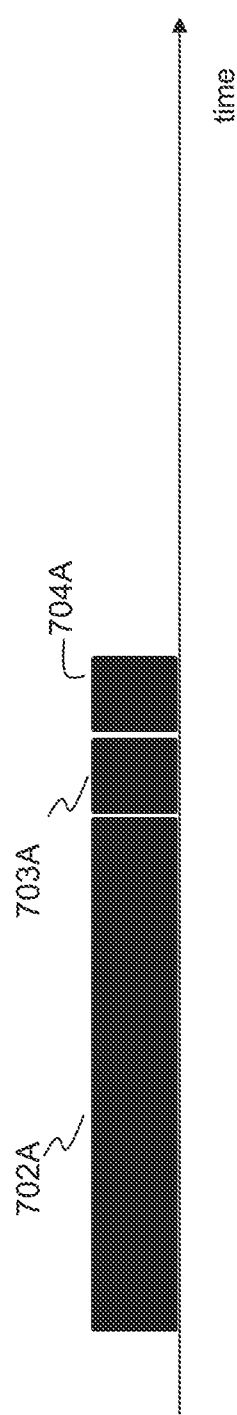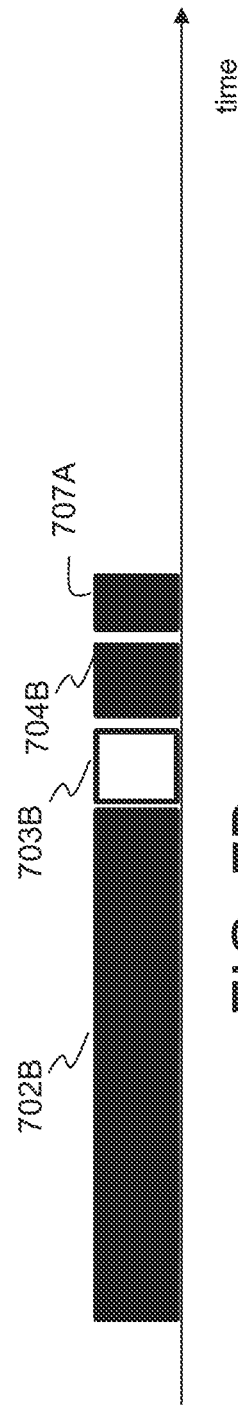

| Sector | Data Value |
|--------|------------|
| 0 | 03 |
| 1 | 01 |
| 2 | 02 |
| ... | ... |
| N | 03 |

FIG. 9

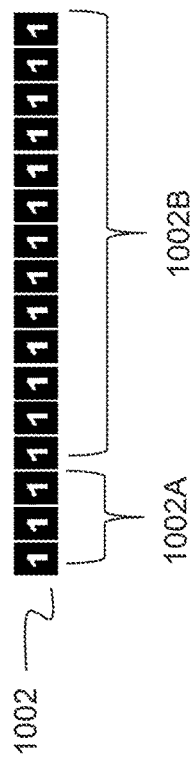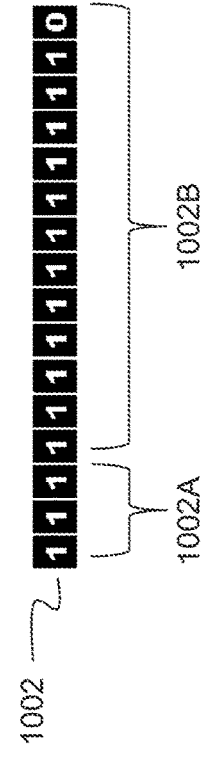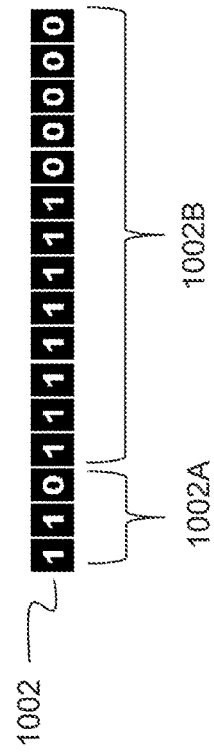

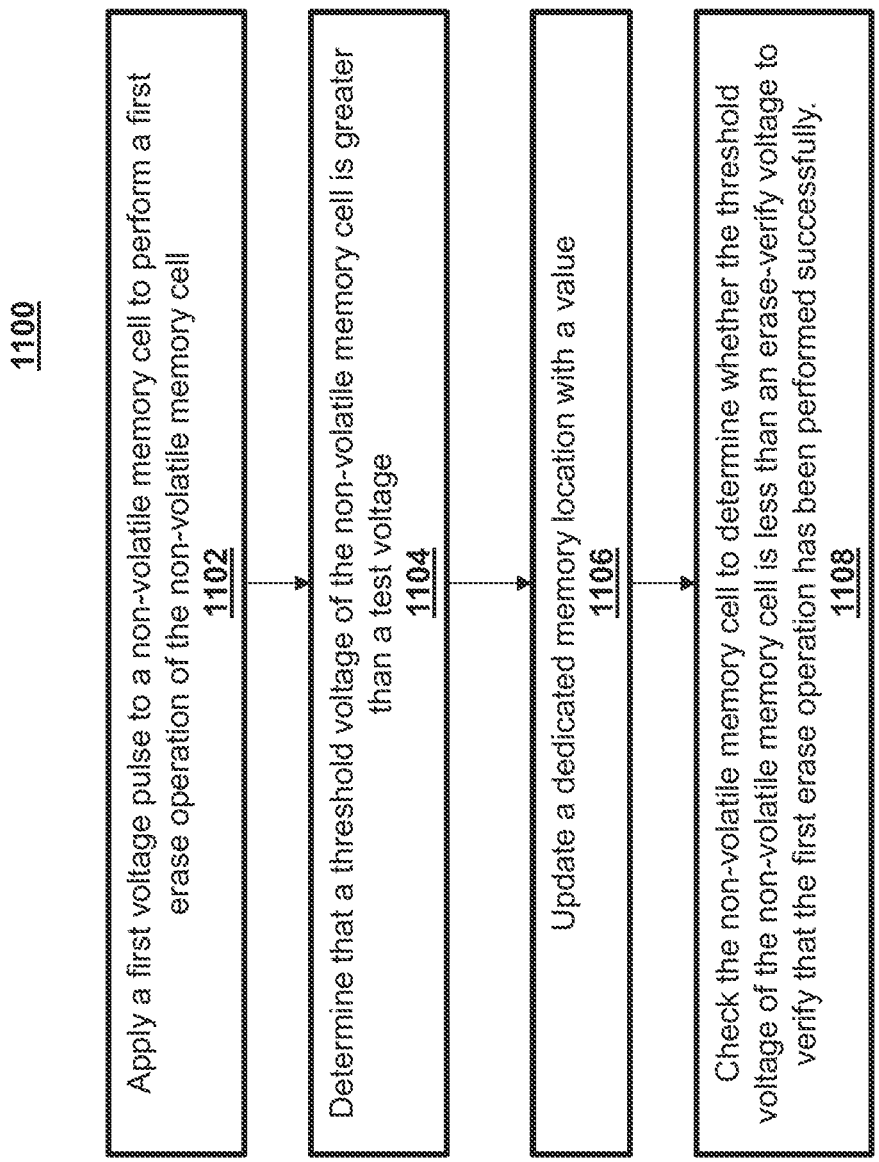

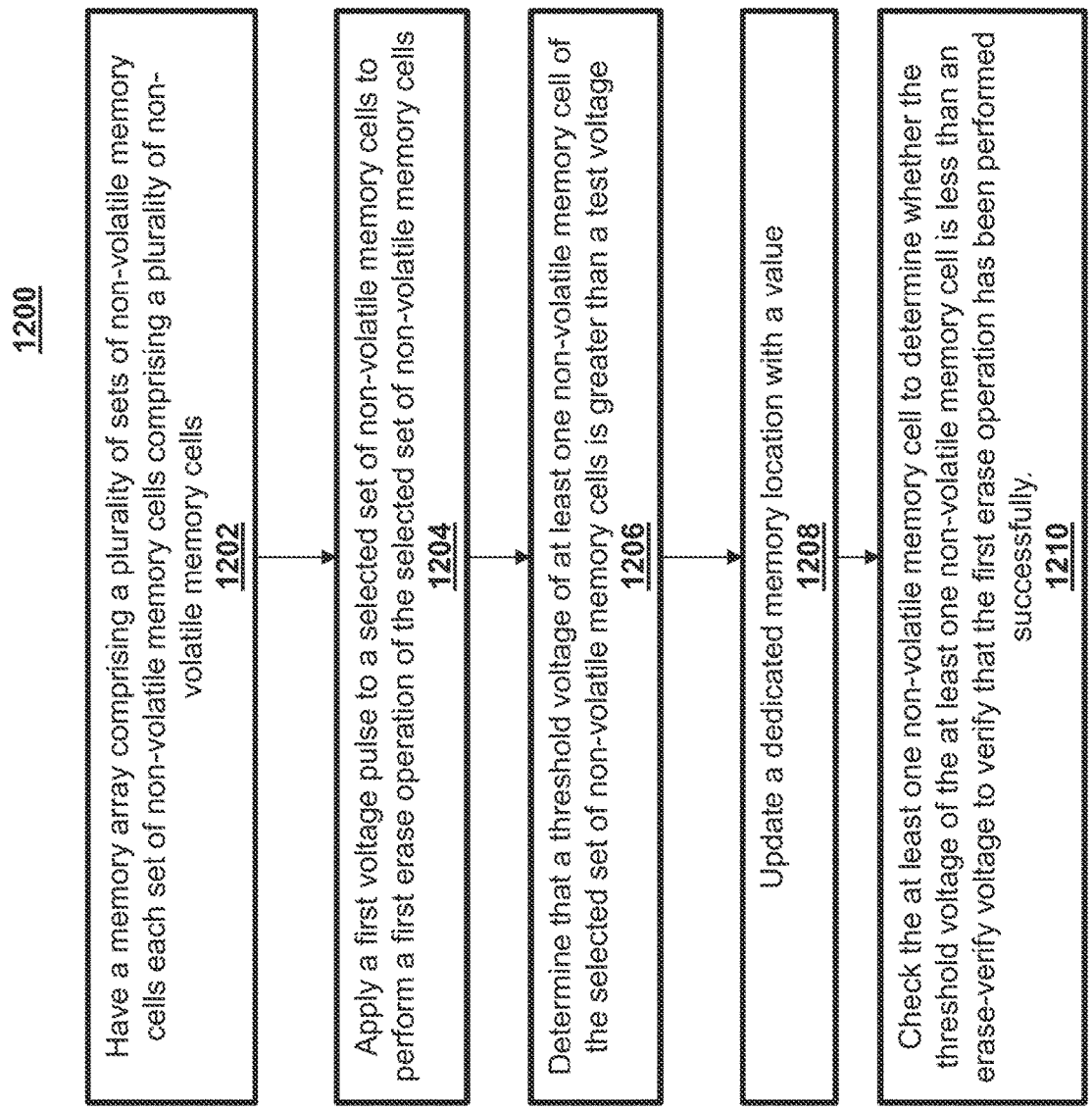

METHODS AND DEVICES FOR ERASING NON-VOLATILE MEMORY

CROSS-REFERENCE TO RELATED APPLICATIONS

This application is a continuation application of U.S. patent application Ser. No. 16/925,059 filed on Jul. 9, 2020. This application is hereby incorporated herein by reference.

TECHNICAL FIELD

The present invention relates to methods and devices for erasing non-volatile memory.

BACKGROUND

Erase operations for non-volatile memory cells can involve application of high voltage pulses to the non-volatile memory cells. The physical characteristics of the non-volatile memory cells may degrade over the life of a memory cell as more erase operations are performed. As a result, a higher voltage pulse may be needed to successfully perform an erase operation. And, multiple voltage pulses may be required for a given erase operation if an initial voltage pulse fails to successfully execute the erase operation. Limiting the number of voltage pulses required to perform erase operations can increase the speed and efficiency of a non-volatile memory erase operation and devices.

SUMMARY

In accordance with an embodiment of the present invention a method includes applying a first voltage pulse to a non-volatile memory cell to perform a first erase operation of the non-volatile memory cell; determining that a threshold voltage of the non-volatile memory cell is greater than a test voltage; updating a dedicated memory location with a value; and checking the non-volatile memory cell to determine whether the threshold voltage of the non-volatile memory cell is less than an erase-verify voltage to verify that the first erase operation has been performed successfully.

In accordance with an embodiment of the present invention, a non-volatile memory device includes a set of non-volatile memory cells, each non-volatile memory cell of the set of non-volatile memory cells 1ncluding a control-gate region and being configured to lose information stored in the non-volatile memory cell when a threshold voltage of the non-volatile memory cell is less than an erase-verify voltage. The non-volatile memory device may further include a biasing circuit configured to apply an erase voltage to each non-volatile memory of the set of non-volatile memory cells between the control-gate region of the non-volatile memory cell and a bulk region of the non-volatile memory cell and being configured to apply a control voltage to the control-gate region of each non-volatile memory cell of the set of non-volatile memory cells. The non-volatile memory device may further include a sensing circuit configured to sense a conduction characteristic of each non-volatile memory cell of the set of non-volatile memory cells 1ndicating whether the threshold voltage of the non-volatile memory cell is less than the control voltage applied to the control-gate region of the non-volatile memory cell; and wherein a control circuit is in communication with the biasing circuit and the sensing circuit and configured to: retrieve a data value from a dedicated memory location corresponding to the set of non-volatile memory cells; execute an erase operation by controlling the biasing circuit to set the erase voltage to a value determined by the data value and to apply the erase voltage to each non-volatile memory cell of the set of non-volatile memory cells to make the threshold voltage of each non-volatile memory cell of the set of non-volatile memory cells less than the erase-verify voltage; execute a test operation to determine whether the threshold voltage of each non-volatile memory cell of the set of non-volatile memory cell is less than a test voltage by controlling the biasing circuit to set the value of the control voltage to the test voltage and to apply the control voltage to each non-volatile memory cell of the set of non-volatile memory cells; and replace the data value in the dedicated memory location with a new data value determined by a result of the test operation.

In accordance with an embodiment of the present invention a method includes having a memory array including a plurality of sets of non-volatile memory cells each set of non-volatile memory cells 1ncluding a plurality of non-volatile memory cells; applying a first voltage pulse to a selected set of non-volatile memory cells to perform a first erase operation of the selected set of non-volatile memory cells; determining that a threshold voltage of at least one non-volatile memory cell of the selected set of non-volatile memory cell is greater than a test voltage; updating a dedicated memory location with a value; and checking the at least one non-volatile memory cell to determine whether the threshold voltage of the at least one non-volatile memory cell is less than an erase-verify voltage to verify that the first erase operation has been performed successfully.

BRIEF DESCRIPTION OF THE DRAWINGS

One or more embodiments will now be described, by way of example only, with reference to the annexed figures, wherein:

FIG. 2A shows the plot, during an erase operation, of a voltage applied to a memory cell;

FIG. 5C illustrates a distribution of threshold voltages for a plurality of memory cells of a set of memory cells before and after a single pulse has been applied to the memory cells for a subsequent erase operation of embodiments;

FIG. 6A depicts a timeline of an erase operation using a known method after a successful single pulse operation;

FIG. 6B depicts a timeline of an erase operation using a known method requiring more than one voltage pulse;

FIG. 7A depicts a timeline of an erase operation after a successful single pulse operation in accordance with embodiments;

FIG. 7B depicts a timeline of an erase operation and an update of an erase voltage for future erase operations in accordance with embodiments;

FIG. 9 depicts an embodiment of a dedicated memory location;

FIG. 10A depicts a 16-bit data value in an initial configuration;

FIG. 10B depicts a 16-bit data value in an incremented configuration;

FIG. 10C depicts a 16-bit data value in an incremented configuration;

FIG. 11 depicts a flow chart of a method of embodiments; and

FIG. 12 depicts a flow chart of a method of embodiments.

DETAILED DESCRIPTION OF ILLUSTRATIVE EMBODIMENTS

Figure 1:
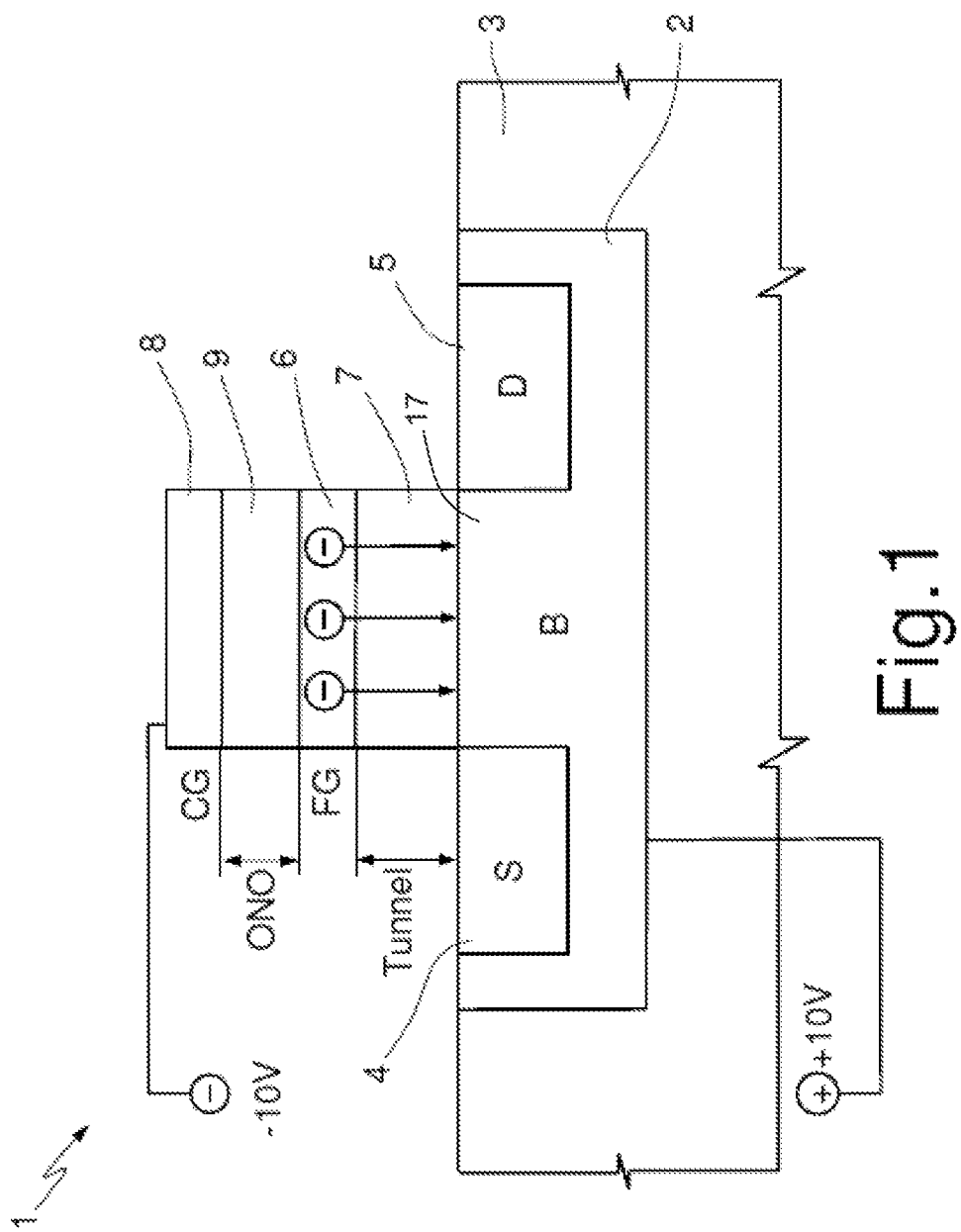
FIG. 1 shows a schematic cross-sectional view of a floating-gate memory cell in a non-volatile flash-memory device.

FIG. 1 shows a schematic cross-sectional view of a floating-gate memory cell in a non-volatile flash-memory device.

As it is known, and as shown schematically in FIG. 1, a memory cell 1, of the floating-gate type, of a non-volatile memory device, for example of a flash type, may comprise: a bulk region 2, for example, with a p-type doping, provided in a substrate 3 of semiconductor material, for example silicon. The memory cell 1 may further comprise a source region 4 and a drain region 5, for example with an n-type doping, provided within a surface portion of the bulk region 2; a floating-gate region 6, arranged above the bulk region 2 and separated from the bulk region 2 by a tunnel-oxide region 7; and a control-gate region 8, arranged above the floating-gate region 6 and separated therefrom by an intermediate oxide (the so-called "ONO") region 9.

For storing information, electric charges are injected from the substrate 3 into the floating-gate region 6 (program operation), thus varying the threshold of the memory cell 1, i.e., the voltage to be applied between the control-gate region 8 and the source region 4 to switch-on the memory cell 1 and obtain conduction of electric current between the source region 4 and the drain region 5.

For a sensing operation, upon application of an appropriate biasing voltage to the control-gate region 8, a sensing circuit detects the conduction characteristic of the memory cell 1, from which it is possible to obtain the stored information.

An erase operation for erasing the information envisages removal of the electric charge stored in the floating-gate region 6, via electron extraction. In particular, this operation envisages (as illustrated in FIG. 1) application of a high electrical field between the bulk region 2, which is brought to a high voltage of a positive value (for example +10 V) and the control-gate region 8, which is brought to a high voltage of a negative value (for example −10 V). In a known manner, the high electrical field that is generated is such as to trigger the Fowler-Nordheim ("FN") tunneling effect, which causes movement of the electrons, which migrate from the floating-gate region 6 through the tunnel-oxide region 7 (once again, as illustrated schematically in FIG. 1).

In particular, in a known manner, the erase operations may be carried out simultaneously on a set of memory cells 1, belonging for example to a same block, sector, or page, of a non-volatile memory device, these cells being thus erased together in a same erase operation.

The erase process may be effective when the applied electrical field has a value sufficient to trigger the FN tunneling effect.

On account of the natural process of degradation of the memory cells 1 (for example, due to charge trapping in the tunnel-oxide region 7), this value, however, increases as the so-called "cycling" (i.e., the number of program/erase cycles undergone by the memory cells 1) increases.

In order to take into account this degradation phenomenon, an approach commonly used for carrying out the erase operation on a set (sector or page) of memory cells 1 envisages iterative application of a certain number of pulses, of an increasing voltage value and of a fixed duration, each followed by a verify operation for verifying that the erase has been successful. The method is interrupted as soon as the verify operation determines that erase has been correctly performed.

FIG. 2A shows the plot, during an erase operation, of a voltage applied to a memory cell.

This approach is illustrated schematically in FIG. 2A, which shows the plot, with pulses of increasing value, of the bulk voltage Vpp, with the control-gate region 8 negatively selected (i.e., set at a voltage VCG of a high negative value, for example −10 V). As previously mentioned, the potential difference between the bulk region 2 and the control-gate region 8 determines the electrical field designed to trigger the FN tunneling effect.

The pulses of the bulk voltage Vpp start from a minimum value Vpp_min, determined in the stage of design or characterization of the non-volatile memory device, and increase step by step by equal increments, up to a maximum value Vpp_max, which is also determined during design or characterization of the memory device. Between successive pulses, this approach envisages a verify step, through a reading, or sensing, operation, to verify that the erase has been successful.

If the verification does not yield a positive result, a subsequent pulse is iteratively applied, with an incremented value; otherwise, when it is verified that erase has been successful (i.e., when it is verified that the value of electrical field required for activation of the FN tunneling effect has been reached or crossed, as shown once again in FIG. 2A) the process ends.

The envelope of all the pulses applied (represented with a dashed line) may determine the slope with which the erase operation is carried out, i.e., the variation in time of the electrical field applied to the memory cells 1, and the rate at which the electrical field reaches and/or crosses the value required for activation of the FN tunneling effect. A high slope may stress the memory cells 1 and accelerate the degradation of the memory cell; this slope thus has an impact on the duration of the erase operation and long-term performance of the memory cell.

As the number of program/erase cycles carried out on the memory cells 1 increases, the value of an electrical field required for activation of the FN tunneling effect also increases, so the number of pulses required to effectively erase of the memory cells 1 also increases, with consequent increase in the overall duration of the erase operation.

Figure 2B:
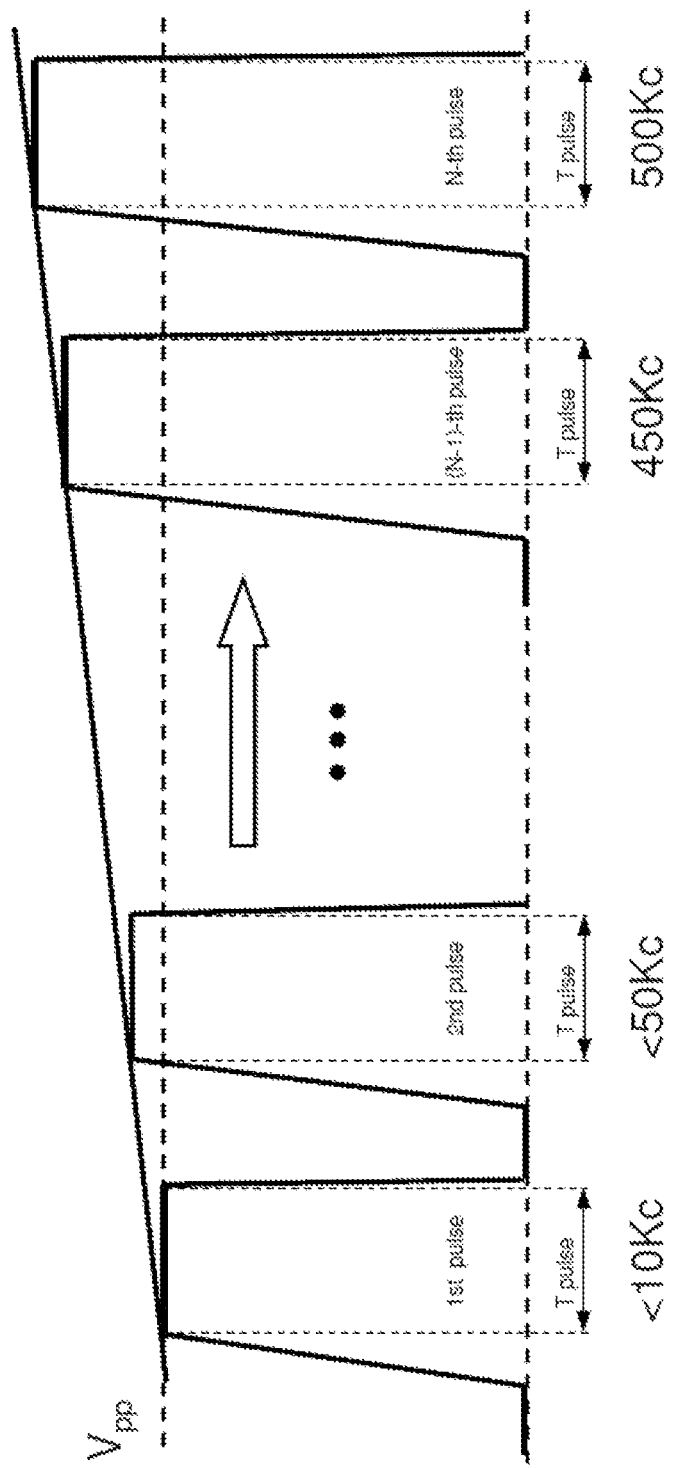
FIG. 2B shows increasing voltages required to perform an erase operation as the number of cycles increase.

FIG. 2B shows increasing voltages required to perform an erase operation as the number of cycles increase.

As indicated schematically in FIG. 2B, as cycling increases, the number of pulses that are required by the erase operation also increases. For example, as illustrated in FIG. 2B, the number of pulses required may increase from one or two pulses required for erasing memory cells with cycling lower than 10 Kc or 50 Kc, to a number N−1 or N of pulses (with N for example equal to 10) required for erasing memory cells with cycling of 450 Kc or 500 Kc.

With a constant duration Tpulse for the various pulses, the time required for the erase operation is thus short for cells with low cycling, but becomes very long for cells with high cycling, possibly becoming incompatible with certain applications of the memory device (in which, for example, a high response rate or, in any case, a pre-set response time substantially constant over time is required). Reducing the number of pulses for erasing memory cell i may thus allow a faster memory.

A known approach for reducing the number of pulses includes storing information associated with the operating configuration that has allowed a past memory operation to be successfully completed, and using this information for restoring the corresponding operating configuration as the starting point for a subsequent memory operation.

Figure 3A:
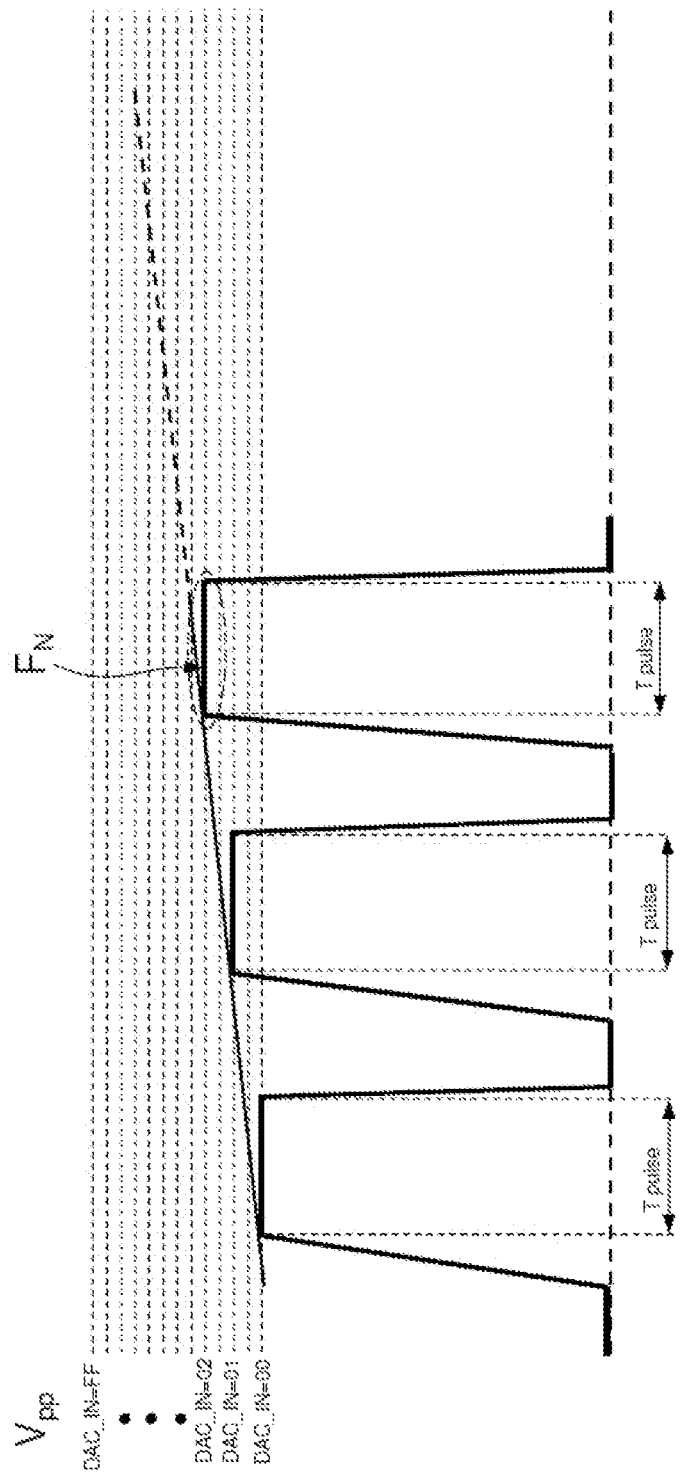
FIG. 3A show a plot of voltage pulses applied during an initial erase operation for a known approach.

FIG. 3A show a plot of voltage pulses applied during an initial erase operation for a known approach.

The known approach illustrated in FIG. 3A includes increasing the value of the pulses until the level of the actual pulse of the bulk voltage Vpp reaches or exceeds the threshold for triggering of the FN tunneling effect and recording information about the configuration that triggered the FN tunneling effect. The information is accessed at the outset of a following erase procedure so a first pulse for the following erase procedure can be equal to the last pulse from a preceding erase operation, which was sufficient in the prior cycle to trigger the FN tunneling effect.

Consistent with this known approach, in the example shown in FIG. 3A, three pulses are required to successfully perform the erase procedure. Erase verifications carried out between the supply of the first and second pulses did not show that an effective erase operation had been successfully performed. So, additional voltage pulses at an increased voltage level were performed. The verification carried out after the third pulse determined that the memory cells 1 of the desired set (for example, a page or a sector) had been effectively erased and that the voltage level of the pulse was great enough to trigger a FN tunneling effect. Information associated to the actual biasing configuration, for example the actual level of the bulk voltage Vpp, or a digital representation, is then stored for use in a subsequent erase procedure.

Figure 3B:
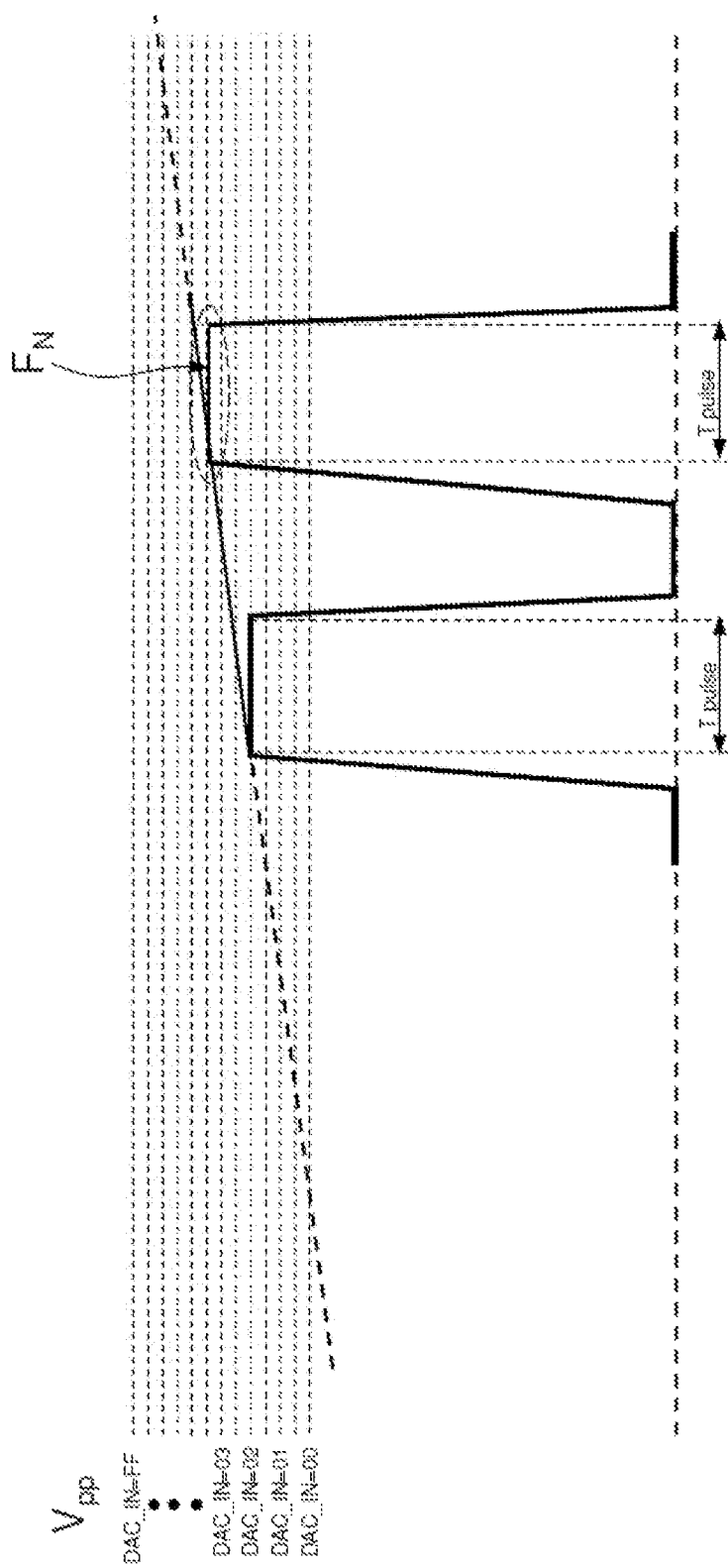
FIG. 3B shows a plot of voltage pulses applied during a subsequent erase operation for a known approach.

FIG. 3B shows a plot of voltage pulses applied during a subsequent erase operation for a known approach.

A subsequent erase operation may be performed on the same set of memory cells 1. The previously stored information about the previous biasing configuration is used to determine the biasing configuration of the first step of the iterative process of the subsequent erase operation according to the information retrieved. In the example in FIG. 3B, the level of the first pulse of the bulk voltage Vpp is the value stored (for which the erase operation previously performed was successful). This first pulse was unsuccessful in the new erase operation so an application of a second pulse is required to successfully execute the erase operation (the level of which will be stored by the control circuit 14 for future memory operations).

This approach prevents some unnecessary pulses. However, it may be desirable to reduce the number of pulses even further.

Figure 4A:
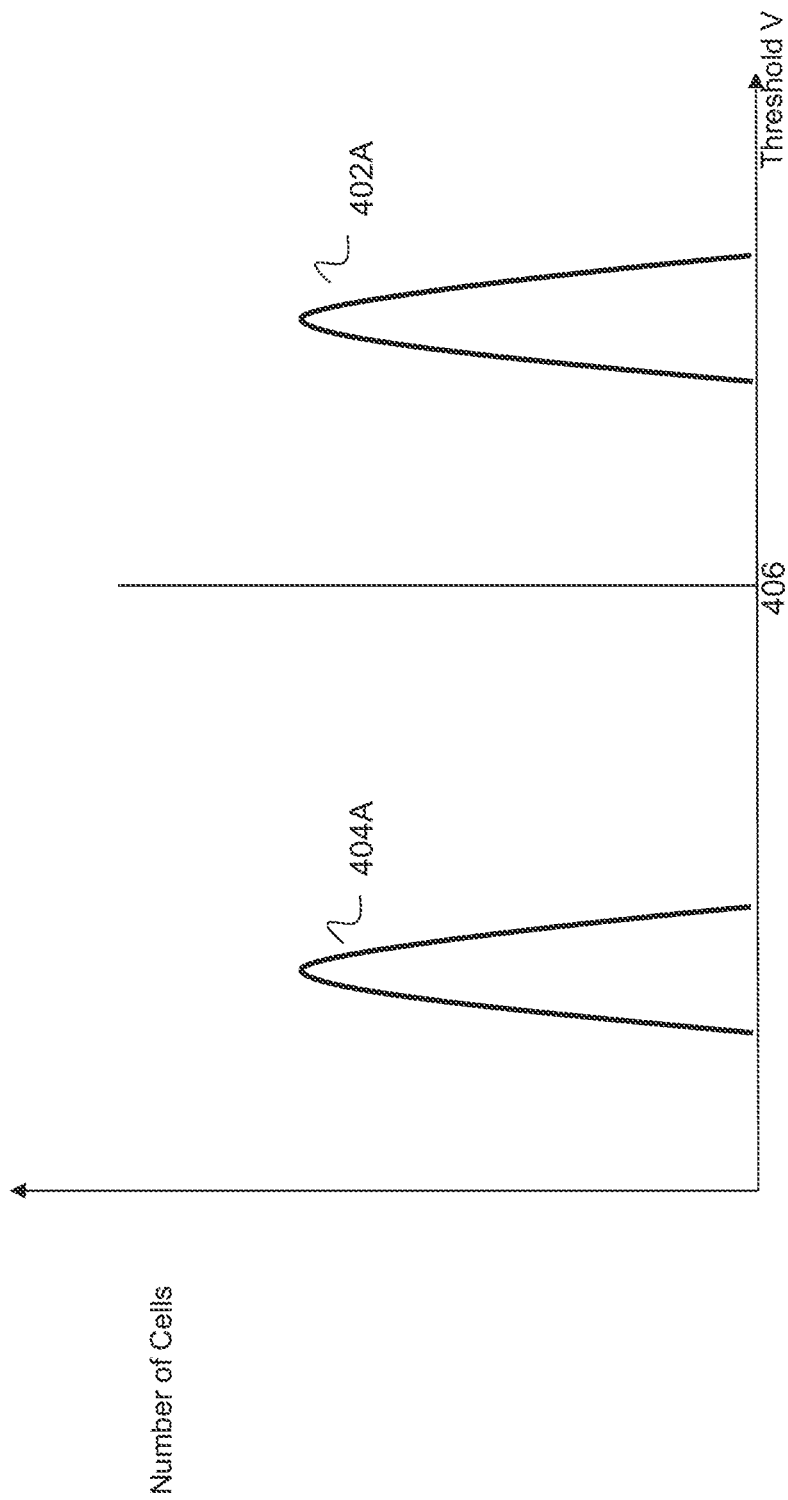
FIG. 4A illustrates a distribution of threshold voltages for a plurality of memory cells of a set of memory cells before and after a single pulse has been applied to the memory cells for an erase operation using a known method.

FIG. 4A illustrates a distribution of threshold voltages for a plurality of memory cells of a set of memory cells before and after a single pulse has been applied to the memory cells 1 for an erase operation using a known method.

FIG. 4A depicts two curves representing the distribution of the threshold voltages of a plurality of memory cells 1. The first curve 402A represents the distribution of the threshold voltages before a single pulse of the erase operation has been performed. And, the second curve 404A represents the distribution of the threshold voltage after the single pulse of the erase operation has been performed. To determine whether an erase operation has been executed successfully, the distribution of the threshold voltages of the plurality of memory cells 1 after the application of the single pulse is compared with an erase-verify voltage 406.

The first curve 402A is greater than the erase-verify voltage 406. The single voltage pulse of the erase operation shifts the distribution of threshold voltages of the memory cells 1 to the second curve 404B. The second curve 404A is less than the erase-verify voltage 406 so the erase operation was successfully executed. No second pulse is needed. And, the configuration of the pulse of the erase operation is saved for a subsequent erase operation. But, as more erase operations are performed, the distribution of threshold voltages of the memory cells 1 will become less sensitive to a voltage pulse at the level that was previously successful. The distribution of threshold voltages of the memory cells will shift less and less. Eventually, the voltage level previously used to successfully execute the previous erase operation will not move the distribution of threshold voltages of the memory cells 1 far enough to successfully perform the erase operation for a subsequent erase operation. In such a situation, the voltage level must be increased, and a second pulse must be applied to complete the erase operation. The new voltage level is stored for future erase operations.

Figure 4B:
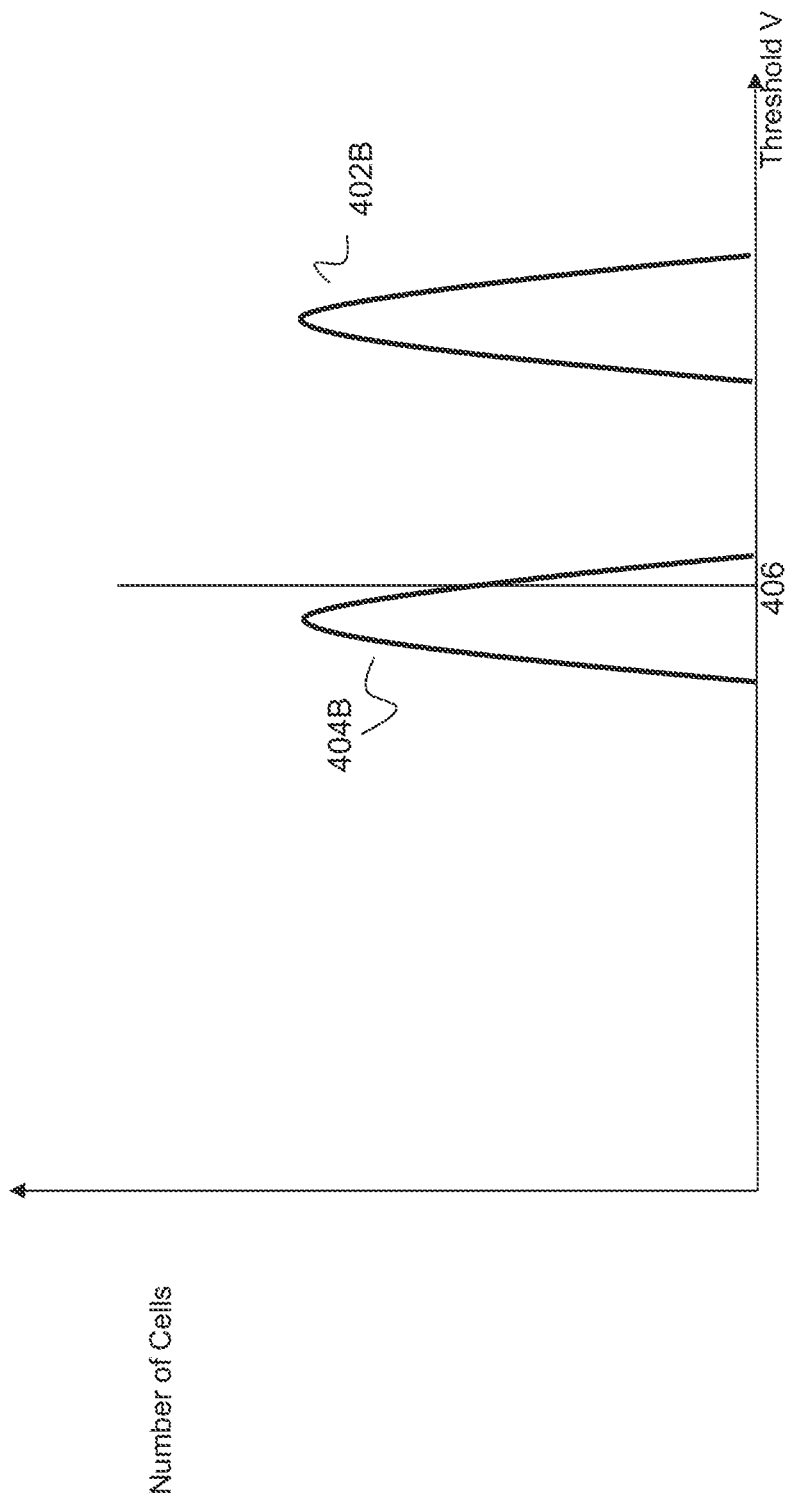
FIG. 4B illustrates a distribution of threshold voltages for a plurality of memory cells of a set of memory cells before and after a single pulse of a subsequent erase operation using a known method.

FIG. 4B illustrates a distribution of threshold voltages for a plurality of memory cells of a set of memory cells before and after a single pulse of a subsequent erase operation using a known method.

The first curve 402B represents the distribution of threshold voltages of the memory cells 1 before a single voltage pulse of a subsequent erase operation. Once again, before the erase operation, the first curve 402B is greater than an erase-verify voltage. But, application of a voltage pulse at the level previously used for the erase operation depicted in FIG. 4A no longer moves the distribution of threshold voltages of the memory cells 1 far enough to clear the erase-verify voltage 406. The voltage pulse at the previous level now only shifts the distribution of threshold voltages of the memory cells 1 from the first curve 402B to a second curve 404B. Only a portion of the second curve 404B is less than the erase-verify voltage 406. So, the first voltage pulse has failed to successfully execute the erase operation.

Figure 4C:
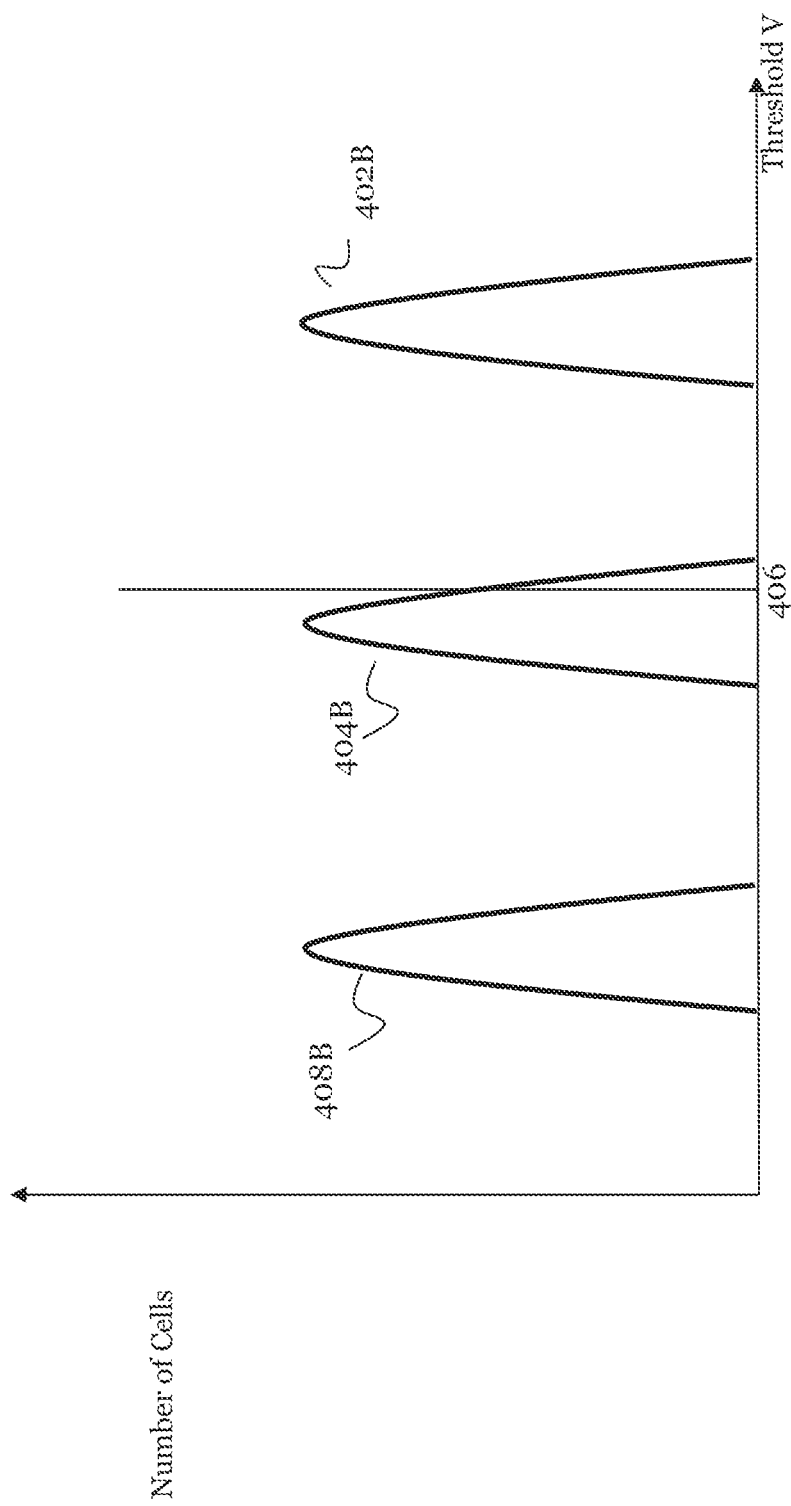
FIG. 4C illustrates a distribution of threshold voltages for a plurality of memory cells of a set of memory cells before and after a second pulse of a subsequent erase operation using a known method requiring a second voltage pulse.

FIG. 4C illustrates a distribution of threshold voltages for a plurality of memory cells of a set of memory cells before and after a second pulse of a subsequent erase operation using a known method requiring a second voltage pulse.

A second voltage pulse at an elevated level is now required to complete the erase operation. FIG. 4C illustrates the distribution of the threshold voltages of the memory cells 1 after a second pulse with a third curve 408B. After the second pulse, the distribution of the threshold voltages of the memory cells has been shifted from the second curve 404B to the third curve 408B, which is entirely below the erase-verify voltage 406.

Eliminating the need for a second voltage pulse, like in FIG. 4C, during some or all erase operations may be advantageous to reduce power consumption, increase the speed of erase operations, and make the duration of erase operations more predictable. These benefits may be advantageously applied in many applications including but not limited to memory devices in apparatuses with high safety levels (in the sectors of telecommunications, pay-tv, field banking, etc.), in microcontrollers (for domotic applications, for radiofrequency applications, for display apparatuses), or in general in the automotive field.

In various embodiments, unnecessary voltage pulses may be avoided by anticipating when a voltage pulse at a given level will fail to adequately shift a distribution of threshold voltages of memory cells 1 enough to execute an erase operation. When anticipating that the given voltage level will soon fail, the voltage may be anticipatorily increased before an erase operation is performed to avoid the need for a second pulse.

Figure 5A:
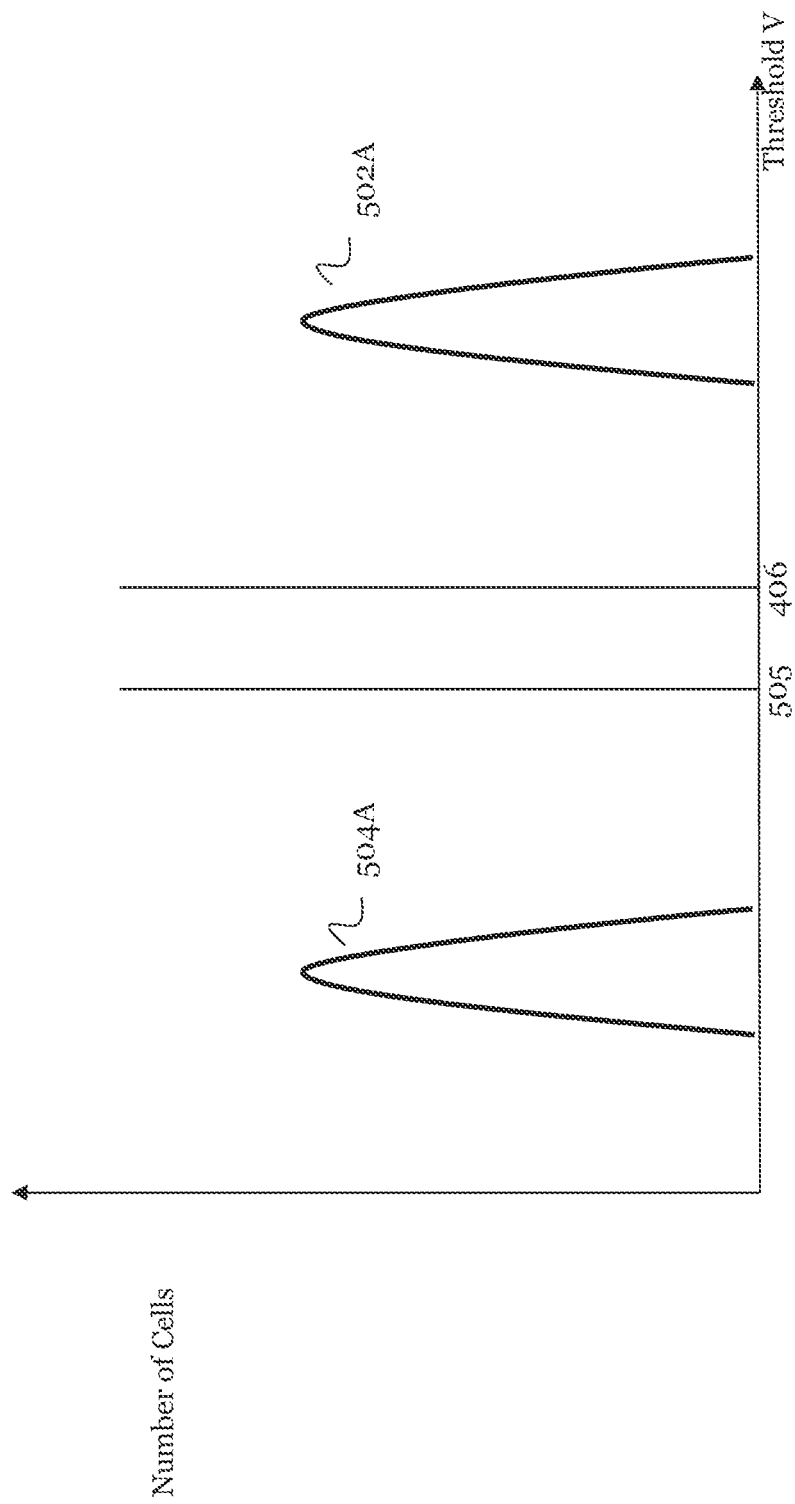
FIG. 5A illustrates a distribution of threshold voltages for a plurality of memory cells of a set of memory cells before and after a single pulse has been applied to the memory cells for an erase operation of embodiments.

FIG. 5A illustrates a distribution of threshold voltages for a plurality of memory cells of a set of memory cells before and after a single pulse has been applied to the memory cells 1 for an erase operation of embodiments.

FIG. 5A, like FIG. 4A, depicts two curves representing the distribution of the threshold voltages of a plurality of memory cells 1 before and after a single pulse of an erase operation performed on the memory cells 1. The first curve 502A represents the distribution of the threshold voltages before a single pulse of an erase operation has been performed. And, the second curve 504A represents the distribution of the threshold voltage after a single pulse of an erase operation has been applied. In various embodiments, the distribution of the threshold voltages of the plurality of memory cells 1 may be compared with a test voltage. 505. As shown in FIG. 5A, the test voltage 505 may be less than an erase-verify voltage. This may allow a comparison between the test voltage and the threshold voltages of the memory cells to anticipate a failure before it occurs.

After application of the single pulse of an erase operation, the distribution of the voltage thresholds of the memory cells 1 shifts from the first curve 502A to the second curve 504A. The second curve 504A is less than the test voltage 505 and the erase-verify voltage indicating that erase operation was successfully executed and that the voltage level of the successful voltage pulse may be maintained for a subsequent erase operation.

Figure 5B:
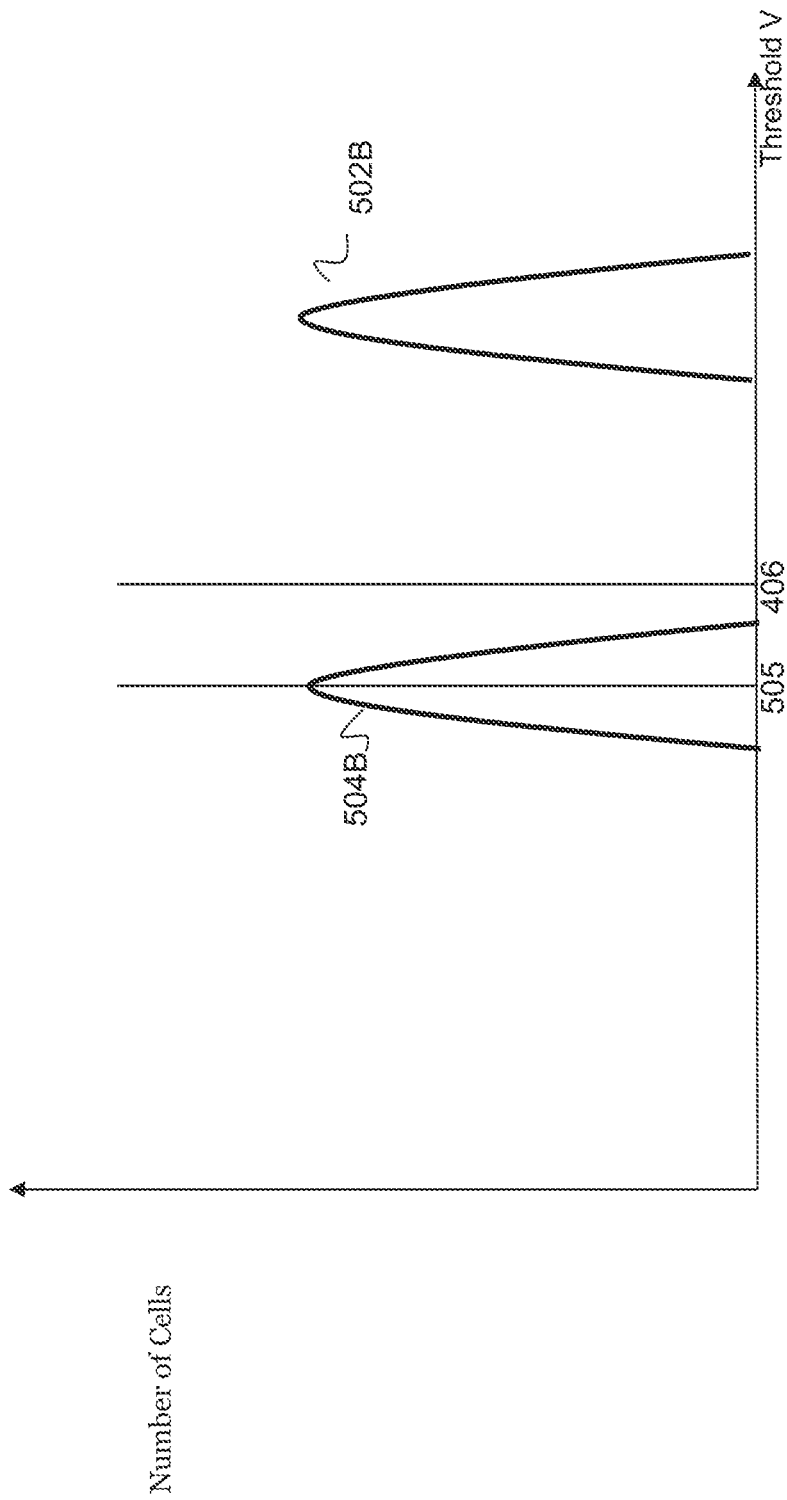
FIG. 5B illustrates a distribution of threshold voltages for a plurality of memory cells of a set of memory cells before and after a single pulse of a subsequent erase operation for embodiments.

FIG. 5B illustrates a distribution of threshold voltages for a plurality of memory cells of a set of memory cells before and after a single pulse of a subsequent erase operation for embodiments.

In FIG. 5B, a first curve 502B again represents the distribution of threshold voltages of the memory cells 1 before a single voltage pulse of a subsequent erase operation. Before the erase operation, the first curve 502B is greater than an erase-verify voltage 406 as well as the test voltage 505. After application of a voltage pulse at the level previously successful to execute an erase operation, the distribution of the threshold voltage of the memory cells may be shifted from the first curve 502B to the second curve 504B. Although, the second curve 504B still clears the erase-verify voltage 406, the effectiveness of the voltage pulse at the previous level may be waning so the distribution of threshold voltages of the memory cells 1 may not be shifted as far as previously. And, the shift of the distribution of the threshold voltage of the memory cells 1 may not clear the test voltage 505 even though it cleared the erase-verify voltage. By comparing the threshold voltages of the memory cell with the test voltage, the failure of the voltage pulse to clear the test voltage 505 may anticipate a future failure to clear the erase-verify voltage during a future erase operation. And, the level of the voltage pulse may be increased when application of the erase voltage fails to shift the distribution of the threshold voltages of the memory cells 1 clear of the test voltage 505—even though the erase memory operation was successful. This may anticipate a future failure and avoid a second pulse during a future erase operation.

FIG. 5C illustrates a distribution of threshold voltages for a plurality of memory cells of a set of memory cells before and after a single pulse has been applied to the memory cells 1 for a subsequent erase operation of embodiments.

The increased voltage level may shift the distribution of the threshold voltages of the memory cells from a first curve 502C, as depicted in FIG. 5C to a second curve 504C. The second curve clears the erase-verify voltage 406 avoiding a second pulse that may have been necessary without the increased level of the voltage pulse applied during the erase operation.

FIG. 6A depicts a timeline of an erase operation using a known method after a successful single pulse operation.

In FIG. 6A, a first voltage pulse 602A is applied to a set of memory cells 1 upon which an erase operation is performed. After application of the first voltage pulse 602A, the threshold voltages of the memory cells 1 are compared with an erase verify voltage at 604A. The comparison at 604A is solid to denote a successful erase operation. In this case, meaning that the distribution threshold voltage of the memory cells 1 has been shifted to be less than the erase-verify voltage. As a result, no second pulse is required and new data regarding the level of the voltage pulse does not need to be saved.

FIG. 6B depicts a timeline of an erase operation using a known method requiring more than one voltage pulse.

In FIG. 6B, a first voltage pulse 602B is applied to a set of memory cells 1 upon which an erase operation is performed. After application of the first voltage pulse 602B, the threshold voltages of the memory cells 1 are compared with an erase verify voltage at 604B. This time, the comparison at 604B indicates that the erase operation was unsuccessful, which is denoted by the unfilled box. The voltage pulse did not shift the distribution of threshold voltages of the memory cells clear of the erase-verify voltage. A second voltage pulse at a higher level is applied at 606B. The threshold voltages of the memory cells 1 are compared with the erase-verify voltage again at 608B after the application of the second pulse. This time, the comparison indicates that the erase operation was successful so no additional pulses are needed. And, the data for the level of the last successful voltage pulse is saved at 610B Eliminating the second pulse 606B and the second comparison 608B can speed up the erase procedure.

FIG. 7A depicts a timeline of an erase operation after a successful single pulse operation in accordance with an embodiment.

In FIG. 7A, a first voltage pulse 702A may be applied to a set of memory cells 1 upon which an erase operation may be performed. After application of the first voltage pulse 702A, the threshold voltages of the memory cells 1 may be compared with a test voltage 703A and an erase verify voltage at 704A. The comparison may indicate that the erase operation was successful, denoted by the solid box at 703A so a second pulse may not be needed. The comparison with the test voltage may indicate that the distribution of threshold voltages of the memory cells 1 has been shifted enough to clear the test voltage so the level of the voltage pulse so it may not be preferable to update the level of the voltage pulse. In various embodiments, the comparison with the erase-verify voltage at 704 may be skipped if the comparison with the test voltage at 703A is successful.

FIG. 7B depicts a timeline of an erase operation and an update of an erase voltage for future erase operations in accordance with embodiments.

In FIG. 7B, a first voltage pulse 702B is applied to a set of memory cells 1 upon which an erase operation may be performed. After application of the first voltage pulse 702B, the threshold voltages of the memory cells 1 of a set may be compared with a test voltage 703B and an erase verify voltage at 704B. The comparison with the erase-verify voltage may indicate that the erase operation was successful—filled box—so a second pulse may not be preferred. But, the comparison with the test voltage may indicate that test operation may not have been passed—empty box—so the level of the voltage pulse for the next erase operation may be increased at 707B by saving a new voltage level to avoid a second pulse during a future erase operation.

In various embodiments, after the application of a voltage pulse, the order of comparisons with the test voltage and the erase verify voltage may be switched. For example, in some embodiments, a comparison may first be made between an erase-verify voltage and the distribution of threshold voltages of the memory cells. And, a comparison may second be made between a test voltage and the distribution of threshold voltages of the memory cells. In some embodiments, it may be preferable to first compare the test voltage with the threshold voltages to avoid a need for an erase-verify comparison. In some cases, a comparison with an erase-verify voltage may be made only after a comparison with a test voltage has failed. This may speed up some erase operations.

Figure 8:
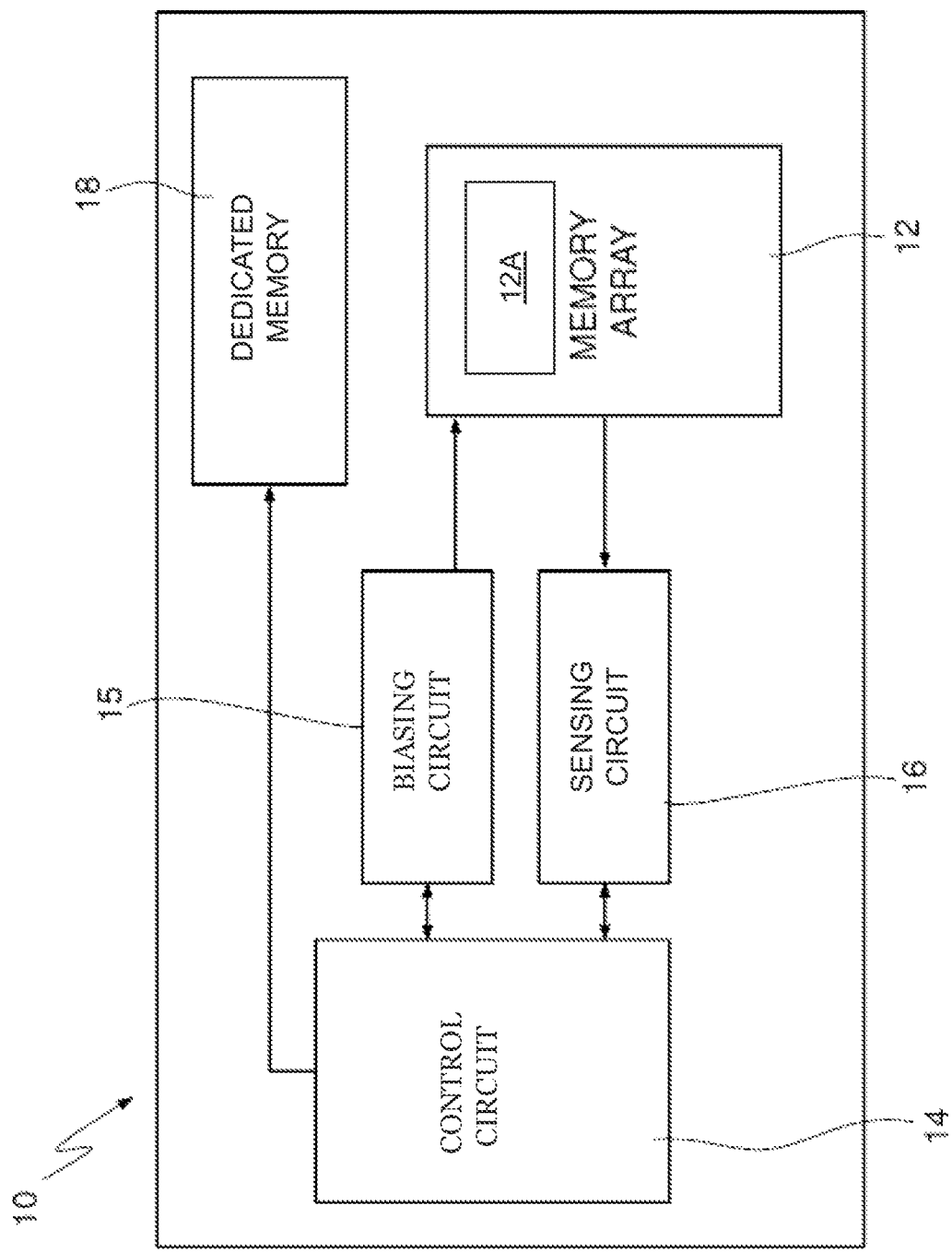
FIG. 8 depicts a schematic of a non-volatile memory device of embodiments.

FIG. 8 depicts a schematic of a memory device 10 of various embodiments.

In various embodiments, the memory device lo may comprise a non-volatile memory device, for example, flash or page-flash type. The memory device lo may comprise a memory array 12, including a plurality of memory cells 1. The memory cells 1 may comprise floating-gate type (for example, as described with reference to FIG. 1). The memory cells 1 may be arranged in rows (word lines) and columns (bit lines) and operatively grouped together in sets (for example, sectors or pages). The sets may comprise different number of memory cells 1 in different embodiments. In various embodiments, each memory cell 1 of a set of memory cells may comprise a floating-gate type. The memory cells 1 may be configured so they lose information stored in them when a threshold voltage of the non-volatile memory cell is less than an erase-verify voltage. This may be accomplished by an erase operation applying a voltage between a control region and bulk region of a memory cell as described with reference to FIG. 1.

Various memory operations of the memory device lo may be performed on all the memory cells 1 of a set simultaneously. For example, an erase operation for erasing the information stored in the memory cells 1 may be carried out in the memory device lo simultaneously for all the memory cells 1 belonging to a set 12A (for example, sector or page).

The memory device lo may further comprises a control circuit 14, which in various embodiments may comprise a microprocessor or microcontroller, which is operatively associated to the memory array 12 and is designed to control operation thereof and in particular to control execution of the memory operations, amongst which, for example, may comprise the erase operation.

The memory device lo may further comprise a biasing circuit 15, in communication with and controlled by the control circuit 14. The biasing circuit 15 may provide appropriate biasing signals to the memory cells 1 of the memory array 12 during the memory operations (for example, the aforesaid pulsed bulk voltage Vpp, during the erase operation). The biasing circuit 15 may be configured to apply an erase voltage to the memory array 12 to perform an erase operation on a selected set of memory cells 1 The set 12A may be selected depending on instructions received by the control circuit that determine which set should be erased. The erase voltage may be applied simultaneously to more than one set of memory cells at a time. In various embodiment, the biasing circuit may comprise a digital to analog convert ("DAC") that receives a control signal DAC_IN from the control circuit.

The biasing circuit may be configured to apply an erase voltage to each memory cell 1 of a set 12A of memory cells between a control-gate region 8 and the bulk region 2 of each memory cell 1 of a set of memory cells for an erase operation being performed on the set 12A of memory cells 1. The erase voltage may be varied by varying the voltage applied to the control-gate region 8, the bulk region 2, or both. The biasing circuit 15 may be configured to apply a control voltage to the control gate-gate region of each memory cell 1 of a set 12A of memory cells to perform an erase-verify operation or a test operation.

The memory device 10 may further comprise a sensing circuit 16, which is also in communication with the control circuit 14, for detecting the conduction characteristics of memory cells 1 (for example, for comparing a control voltage with a threshold voltage of a memory cell 1 or set of memory cells 1 during the erase-verify operations, test operations, or both). The sensing circuit may comprise a sense amplifier.

The conduction characteristic of a memory cell 1 may indicate whether the threshold voltage of the memory cell 1 is less than a control voltage applied to the control-gate region 8 of the memory cell 1. In various embodiments, the sensing circuit 16 may comprise a sense amplifier that detects current passing through a channel formed between the source region 4 and drain region 5 of a memory cell when an appropriate voltage is applied to the control-gate region 8. The area where the channel forms in a memory cell 1 is denoted in FIG. 1 by 17.

The memory device 10 may comprise a dedicated memory location 18 managed by, and in communication with the control circuit 4. The dedicated memory location 18, may comprise memory cells 1. In various embodiments, the dedicated memory location 18 may not be accessible to the user of the memory device 10 for memory operations. Information of the configuration of the memory device 10—like the voltage level for future erase operations on corresponding memory sets—may be stored in this dedicated memory location 18. The dedicated memory location 18, in various embodiments, may be part of the memory array 12 that cannot be accessed by a user.

Figure 9:
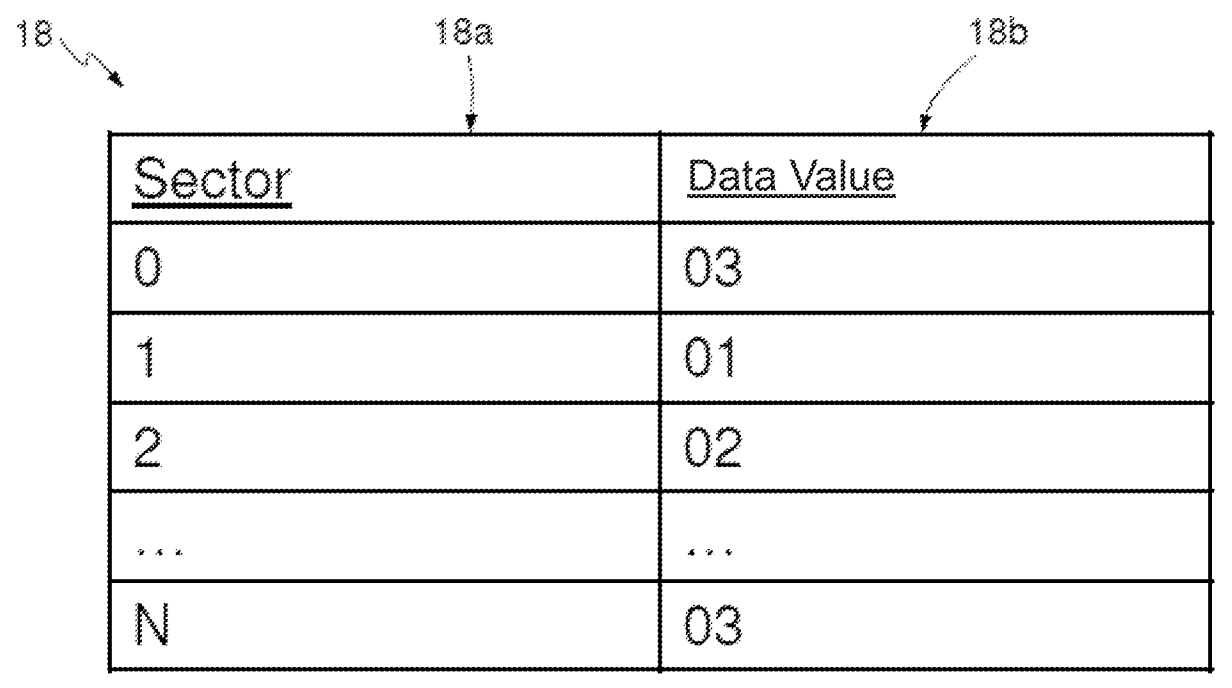

FIG. 9 depicts an embodiment of a dedicated memory location.

The control circuit 14 may be configured to retrieve a data value from the dedicated memory location 18. As illustrated schematically in FIG. 9, a dedicated memory location 18 may comprise a look-up table (LUT) having a first field 18a, "Sector", containing a reference associated to a sector (or page, set, or other type of group) of memory cells 1, and a second field 18b, "Data Value", in which, in association with the corresponding sector, the configuration used the next memory operation is stored (for example, the level of the bulk voltage Vpp that will be used for carrying out an erase operation, or, likewise, the digital value of the corresponding digital control signal DAC_IN delivered to a DAC of the biasing circuit 15).

In various embodiments, the data value stored in a second field 1813. may comprise a variety of forms.

FIG. 10A depicts a 16-bit data value in an initial configuration.

In various embodiments, the data value 1002 may incremented and correspond to a value of an erase voltage for an erase operation. In various embodiments it may be preferable to vary the voltage applied to the control-gate region 8 of a memory cell, the voltage applied to the bulk region 2 of a memory cell, or both to alter an erase voltage for an erase operation. In some embodiments, a first section 1002A, comprising the three most significant bits depicted in FIG. 10, may determine a voltage value to be applied to control-gate regions 8 of the memory cells 1 for an erase operation. A second section 1002B, comprising the thirteen most significant bits depicted in FIG. 10, may correspond to a voltage value to be applied to the bulk region 2 of the memory cells 1 for an erase operation.

An initial setting of the data value 1002 may correspond to an initial voltage level for an erase voltage for the first erase operation at the beginning of the life cycle of a memory device 10. The initial voltage level needed to perform the first operation may be determined during manufacturing or testing of the memory device 10. The initial value of the data value may comprise all "1"s, in various embodiments. However, it will be appreciated that the initial value can comprise any combination of digital values desired. The data value 1002 may be changed by varying the bits of the data value 1002. This may also change the level of an erase voltage based on the data value 1002. The first section 1002A, the second section 1002B, or both may be changed to vary the level of the erase voltage.

FIG. 10B depicts a 16-bit data value in an incremented configuration.

The data value 1002 may be incremented by changing the value of the one of the bits of the data value 1002. In FIG. 10B, the least significant bit of the second section 1002B of the data value 1002 has been switched from a "1" to a "0". This new configuration may be corresponded to an increased erase voltage level. Each possible value of the data value 1002 may be corresponded to an erase voltage level. In various embodiments, the bits of the data value 1002 may only be changed once so a 16-bit data value would allow increments, each corresponding to different possible value for an erase voltages.

FIG. 10C depicts a 16-bit data value in an incremented configuration.

The least significant bit of the first section 1002A has been incremented in FIG. 10C. This may correspond to a change in the value of the voltage to be applied at control-gate region 8 of a memory cell 1. The five least significant of the second section 1002B have also been incremented. The configuration of the data value 1002 in FIG. 10C may correspond to six increments from the initial value of the data value 1002 in FIG. 10A. It should be appreciated, however, that the data value 1002 may be incremented in any way desired. In various embodiments, the data value may comprise more, or less, bits, it may have more or less sections, and the sections may comprise different lengths.

Returning to FIG. 8, the control circuit 14 of the memory device may be configured to execute an erase operation after retrieving a data value 1002 from the dedicated memory location 18 corresponding to a set 12A of the memory array 12. Depending on the data value 1002, the control circuit 14 may deliver a control signal to the biasing circuit 15. In various embodiments, the control signal may comprise a DAC_IN for a DAC of the biasing circuit. The biasing circuit 15, under the direction of the control circuit 14 may then apply an erase voltage to the memory cells 1 of the set 12A of the memory selected for the erase operation.

The control circuit 14 may also be configured to perform a test operation to determine if the distribution of the threshold voltages of the memory cells 1 of the selected set 12A of memory cells 1 is less than a test voltage 505. This may be accomplished by controlling the biasing circuit 15 to apply a control voltage at a level equal to the test voltage 505 to the memory cells 1 of the set 12A of the memory array 12. The sensing circuit 16 may detect a conduction characteristic of the memory cells 1 of the set 12A of memory cells of the memory array 12, which may be used to determine whether the distribution of the threshold voltages of the memory cells 1 is greater than or less than the test voltage 505. The set 12A may be determined to have passed the test operation if it is determined that all, a predetermined number, or percentage of the threshold voltages of the memory cells has been moved enough to clear the test voltage 505. If a set 12A passes the test operation, the voltage level of the erase voltage may not need to be increased.

If the set 12A does not pass the test operation, this may indicate that the effectiveness of the erase voltage is waning. As discussed, at least with reference to FIG. 5A, FIG. 5B, FIG. 5C, FIG. 7A, and FIG. 7B this may allow the memory device lo to detect future failures and anticipatorily increase the level of the erase voltage for a subsequent erase operation to avoid needing more than one pulse to complete an erase operation. In various embodiments, the control circuit 14 may be triggered to update the data value—as by incrementing the data value for voltage levels corresponding to the set of non-volatile memory cells 1n various embodiments—when the test operation is not passed (i.e. the threshold voltage has not been shifted below the test voltage 505, in various embodiments). In various embodiments, this may occur when current detected by the sensing circuit 16 during a test operation is less than a reference current. This may indicate that the test voltage 505 does not turn the memory cells ON, which may mean that no channel is formed between the source region 4 and drain region 5 of the memory cells to allow current. This may indicate that the threshold voltage of a memory cell being tested greater than the test voltage 505.

After, a test operation has been failed, various embodiments may delay the increase in the erase voltage level. For example, after a set 12A fails to pass a test operation, the control circuit may wait a 2 cycles before updating the data value and increasing the erase voltage. As will be appreciated, the length of the delay in terms of erase cycles may vary in different embodiments.

In various embodiments, the control circuit 14 may increase the level of the erase voltage for future erase operation by replacing the data value 1002 in the dedicated memory location 18 with a new value. In some embodiments, this may be achieved by incrementing the data value 1002 as described with reference to FIG. 10A, FIG. 10B, and FIG. 10C. The new value may be corresponded to a higher level for an erase voltage so the erase voltage will be increased for the next erase operation or a future erase operation if the update is delayed.

The control circuit may also be configured to execute an erase-verify operation by controlling the biasing circuit to 14 to apply a control voltage at a level equal to an erase-verify voltage 406 to the memory cells 1 of the set 12A of the memory array. The sensing circuit 16 may detect the current characteristic of the memory cells 1 of the set 12A of the memory array 12 when the erase-verify voltage 406 is applied, which may be used to determine whether the threshold voltages of the memory cells 1 of the set 12A of the memory array 12 are greater or less than the erase-verify voltage. If test is failed, the voltage level may be increased and a second pulse applied to the memory cells 1 of the set 12A of the memory array 12 to complete the erase operation.

Finally, it is clear that modifications and variations may be made to what has been described and illustrated herein, without thereby departing from the scope of the present invention, as defined in the appended claims.

It is also emphasized that the solution described may be applied in general to any memory operation that may be optimized on the basis of the knowledge of the configuration of the previous memory operation carried out on the same memory cells, and may be applied to any non-volatile memory device.

For example, the solution described may be applied to programming operations carried out in the non-volatile memory device in the case where (for reasons of power consumption or the like) a programming operation is required having a reduced parallelism, so that the duration thereof may be considerable. Further, it should be appreciated that the scope of this disclosure is not limited a single type of memory cell. Various other memory cells, including other doping types may be utilized in various embodiments. This may impact other configurations, for example the voltage needed to form a channel in a memory cell and the location of an erase verify voltage and test voltage relative to a threshold voltage. A memory cell of another type may have a test voltage that is greater than an erase verify location.

FIG. 11 depicts a method 1100 of an embodiment.

The method 1100 may comprise at a step 1102 applying a first voltage pulse to a non-volatile memory cell to perform a first erase operation of the non-volatile memory cell; and at a step 1104 determining that a threshold voltage of the non-volatile memory cell is greater than a test voltage. The method 1100 may further comprise at a step 1106 updating a dedicated memory location with a value; and at a step 1108 checking the non-volatile memory cell to determine whether the threshold voltage of the non-volatile memory cell is less than an erase-verify voltage to verify that the first erase operation has been performed successfully.

In various embodiments the method 1100 may further comprise, further comprise confirming that the first erase operation has been performed successfully; and applying a second voltage pulse to the non-volatile memory cell to perform a second erase operation of the non-volatile memory cell, the second voltage pulse being based on the value of the dedicated memory location.

The method 1100 may comprise in various embodiments, wherein the value of the dedicated memory location comprises operating parameters for generating the second voltage pulse.

In various embodiments, the method 1100 may further comprise, wherein the non-volatile memory cell comprises a floating gate memory cell comprising a bulk region and a control-gate region and wherein the first voltage pulse is applied between the control-gate region and the bulk region.

In various embodiments, the method 1100 may further comprise, wherein determining the threshold voltage of the non-volatile memory cell is greater than the test voltage comprises applying the test voltage to the control-gate region of the non-volatile memory cell and sensing a current characteristic through a channel of the non-volatile memory cell.

In various embodiments, the method 1100 may further comprise: determining that the threshold voltage of the non-volatile memory cell is greater than the erase-verify voltage; and applying a second voltage pulse to the non-volatile memory cell to complete the first erase operation of the non-volatile memory cell, the second voltage pulse being determined by the value of the dedicated memory location.

In various embodiments, the method 1100 may further comprise wherein the test voltage is less than the erase-verify voltage.

FIG. 12 depict a method 1200 of embodiments.

The method 1200 may comprise at a step 1202 having a memory array comprising a plurality of sets of non-volatile memory cells each set of non-volatile memory cells comprising a plurality of non-volatile memory cells; at a step 1204 applying a first voltage pulse to a selected set of non-volatile memory cells to perform a first erase operation of the selected set of non-volatile memory cells; at a step 1206 determining that a threshold voltage of at least one non-volatile memory cell of the selected set of non-volatile memory cell is greater than a test voltage; at a step 1208 updating a dedicated memory location with a value; and at a step 1210 checking the at least one non-volatile memory cell to determine whether the threshold voltage of the at least one non-volatile memory cell is less than an erase-verify voltage to verify that the first erase operation has been performed successfully.

In various embodiments the method 1200 may further comprise, confirming that the first erase operation has been performed successfully; and applying a second voltage pulse to the selected set of non-volatile memory cells to perform a second erase operation of the selected set of non-volatile memory cells, the second voltage pulse being determined by the value of the dedicated memory location.

In various embodiments the method 1200 may further comprise, wherein the value of the dedicated memory location comprises operating parameters for generating the second voltage pulse.

In various embodiments the method 1200 may further comprise, wherein each non-volatile memory cell of the plurality of non-volatile memory cells of the selected set of non-volatile memory cells comprises a floating gate memory cell comprising a bulk region and a control-gate region and wherein the first voltage pulse is applied between the control-gate region and the bulk region of each non-volatile memory cell.

In various embodiments the method 1200 may further comprise, wherein determining that the threshold voltage of the at least one non-volatile memory cell of the selected set of non-volatile memory cells is greater than the test voltage comprises applying the test voltage to the control-gate region of the at least one non-volatile memory cell of the selected set of non-volatile memory cells and sensing a current characteristic through a channel of the at least one non-volatile memory cell of the selected set of non-volatile memory cells.

In various embodiments the method 1200 may further comprise, determining that a threshold voltage of one or more non-volatile memory cells of the selected set of non-volatile memory cell is greater than the erase-verify voltage; and applying a second voltage pulse to the selected set of non-volatile memory cells to complete the first erase operation of the non-volatile memory cell, the second voltage pulse being determined by the value of the dedicated memory location.

In various embodiments the method 1200 may further comprise, wherein the test voltage is less than the erase-verify voltage.

Example embodiments of the invention are summarized here. Other embodiments can also be understood from the entirety of the specification as well as the claims filed herein.

Example 1. A method including: applying a first voltage pulse to a non-volatile memory cell to perform a first erase operation of the non-volatile memory cell; determining that a threshold voltage of the non-volatile memory cell is greater than a test voltage; updating a dedicated memory location with a value; and checking the non-volatile memory cell to determine whether the threshold voltage of the non-volatile memory cell is less than an erase-verify voltage to verify that the first erase operation has been performed successfully.

Example 2. The method of example 1, further including: confirming that the first erase operation has been performed successfully; and applying a second voltage pulse to the non-volatile memory cell to perform a second erase operation of the non-volatile memory cell, the second voltage pulse being based on the value of the dedicated memory location.

Example 3. The method of example 1 or example 2, wherein the value of the dedicated memory location includes operating parameters for generating the second voltage pulse.

Example 4. The method of Example 1 to example 3, wherein the non-volatile memory cell includes a floating gate memory cell including a bulk region and a control-gate region and wherein the first voltage pulse is applied between the control-gate region and the bulk region.

Example 5. The method of Example 1 to Example 4, wherein determining the threshold voltage of the non-volatile memory cell is greater than the test voltage includes applying the test voltage to the control-gate region of the non-volatile memory cell and sensing a current characteristic through a channel of the non-volatile memory cell.

Example 6. The method of Examples 1 to Example 5, further including: determining that the threshold voltage of the non-volatile memory cell is greater than the erase-verify voltage; and applying a second voltage pulse to the non-volatile memory cell to complete the first erase operation of the non-volatile memory cell, the second voltage pulse being determined by the value of the dedicated memory location.

Example 7. The method of Example 1 to Example 6, wherein the test voltage is less than the erase-verify voltage.

Example 8. A non-volatile memory device including: a set of non-volatile memory cells, each non-volatile memory cell of the set of non-volatile memory cells including a control-gate region and being configured to lose information stored in the non-volatile memory cell when a threshold voltage of the non-volatile memory cell is less than an erase-verify voltage; a biasing circuit configured to apply an erase voltage to each non-volatile memory of the set of non-volatile memory cells between the control-gate region of the non-volatile memory cell and a bulk region of the non-volatile memory cell and being configured to apply a control voltage to the control-gate region of each non-volatile memory cell of the set of non-volatile memory cells; a sensing circuit configured to sense a conduction characteristic of each non-volatile memory cell of the set of non-volatile memory cells indicating whether the threshold voltage of the non-volatile memory cell is less than the control voltage applied to the control-gate region of the non-volatile memory cell; and wherein a control circuit is in communication with the biasing circuit and the sensing circuit and configured to: retrieve a data value from a dedicated memory location corresponding to the set of non-volatile memory cells; execute an erase operation by controlling the biasing circuit to set the erase voltage to a value determined by the data value and to apply the erase voltage to each non-volatile memory cell of the set of non-volatile memory cells to make the threshold voltage of each non-volatile memory cell of the set of non-volatile memory cells less than the erase-verify voltage; execute a test operation to determine whether the threshold voltage of each non-volatile memory cell of the set of non-volatile memory cell is less than a test voltage by controlling the biasing circuit to set the value of the control voltage to the test voltage and to apply the control voltage to each non-volatile memory cell of the set of non-volatile memory cells; and replace the data value in the dedicated memory location with a new data value determined by a result of the test operation.

Example 9. The non-volatile memory device of Example 8, wherein the control circuit is further configured to execute an erase-verify operation to determine whether the threshold voltage of each non-volatile memory cell of the set of non-volatile memory cell is less than the erase-verify voltage by controlling the biasing circuit to set the value of the control voltage to the erase-verify voltage and to apply the control voltage to each non-volatile memory cell of the set of non-volatile memory cells.

Example 10. The non-volatile memory device of Example 8 or Example 9, wherein the new data value is equal to the data value when each non-volatile memory cell of the set of non-volatile memory cell is determined to be less than the test voltage.

Example 11. The non-volatile memory device of Example 8 to Example 10, wherein the new data value is incremented from the data value when at least one non-volatile memory cell of the set of non-volatile memory cell is determined not to be less than the test voltage.

Example 12. The non-volatile memory device of Example 8 to Example 11, wherein the test voltage is less than the erase-verify voltage.

Example 13. The non-volatile memory device of Example 8 to Example 12, wherein each non-volatile memory cell of the set of non-volatile memory cells includes a floating gate memory cell.

Example 14. The non-volatile memory device of Example 8 to Example 13, wherein the control voltage is applied to each non-volatile memory cell of the set of non-volatile memory cells between the control-gate region of the non-volatile memory cell and a source region of the non-volatile memory cell.

Example 15. A method including: having a memory array including a plurality of sets of non-volatile memory cells each set of non-volatile memory cells including a plurality of non-volatile memory cells; applying a first voltage pulse to a selected set of non-volatile memory cells to perform a first erase operation of the selected set of non-volatile memory cells; determining that a threshold voltage of at least one non-volatile memory cell of the selected set of non-volatile memory cell is greater than a test voltage; updating a dedicated memory location with a value; and checking the at least one non-volatile memory cell to determine whether the threshold voltage of the at least one non-volatile memory cell is less than an erase-verify voltage to verify that the first erase operation has been performed successfully.

Example 16. The method of Example 15, further including: confirming that the first erase operation has been performed successfully; and applying a second voltage pulse to the selected set of non-volatile memory cells to perform a second erase operation of the selected set of non-volatile memory cells, the second voltage pulse being determined by the value of the dedicated memory location.

Example 17. The method of Example 15 or Example 16, wherein the value of the dedicated memory location includes operating parameters for generating the second voltage pulse.

Example 18. The method of Example 15 to Example 17, wherein each non-volatile memory cell of the plurality of non-volatile memory cells of the selected set of non-volatile memory cells includes a floating gate memory cell including a bulk region and a control-gate region and wherein the first voltage pulse is applied between the control-gate region and the bulk region of each non-volatile memory cell.

Example 19. The method of Example 15 to Example 18, wherein determining that the threshold voltage of the at least one non-volatile memory cell of the selected set of non-volatile memory cell is greater than the test voltage includes applying the test voltage to the control-gate region of the at least one non-volatile memory cell of the selected set of non-volatile memory cells and sensing a current characteristic through a channel of the at least one non-volatile memory cell of the selected set of non-volatile memory cells.

Example 20. The method of Example 15 to Example 19, further including: determining that a threshold voltage of one or more non-volatile memory cells of the selected set of non-volatile memory cell is greater than the erase-verify voltage; and applying a second voltage pulse to the selected set of non-volatile memory cells to complete the first erase operation of the non-volatile memory cell, the second voltage pulse being determined by the value of the dedicated memory location.

Example 21. The method of Example 15 to Example 19, wherein the test voltage is less than the erase-verify voltage.

References to illustrative embodiments in this description are not intended to be construed in a limiting sense. Various modifications and combinations of the illustrative embodiments, as well as other embodiments will be apparent to persons skilled in the art upon reference to the description. It is therefore intended that the appended claims encompass any such modifications or embodiments.

What is claimed is:

1. A non-volatile memory device comprising:
a non-volatile memory cell configured to conduct current in response to application of a threshold voltage, the non-volatile memory cell comprising an unwritten state when the threshold voltage is less than an erase-verify voltage;
a biasing circuit configured to apply voltage to the non-volatile memory cell;
a sensing circuit configured to sense whether the non-volatile memory cell conducts current; and
a control circuit in communication with the biasing circuit and the sensing circuit, the control circuit being configured to
control the biasing circuit to apply an erase voltage to the non-volatile memory cell to reduce the threshold voltage, the erase voltage having a magnitude set by operating parameters stored in a data location,
control the biasing circuit to apply a test voltage to the non-volatile memory cell to determine whether the threshold voltage is less than the test voltage, the test voltage being less than the erase-verify voltage; and
replace the operating parameters in the data location with new operating parameters in response to determining that the threshold voltage of the non-volatile memory cell is greater than the test voltage.

2. The non-volatile memory device of claim 1, wherein the control circuit is further configured to execute an erase-verify operation to determine whether the threshold voltage of the non-volatile memory cell is less than the erase-verify voltage by controlling the biasing circuit to apply the erase-verify voltage to the non-volatile memory cell.

3. The non-volatile memory device of claim 2, wherein the control circuit is configured to apply an additional erase voltage to the non-volatile memory cell to reduce the threshold voltage in response to determining that the threshold voltage of the non-volatile memory cell is greater than the erase-verify voltage, the additional erase voltage having a magnitude set by the new operating parameters stored in the data location.

4. The non-volatile memory device of claim 1, wherein the new operating parameters are incremented from the operating parameters.

5. The non-volatile memory device of claim 1, wherein the non-volatile memory cell comprises a floating gate memory cell.

6. The non-volatile memory device of claim 5, wherein a control voltage is applied to the non-volatile memory cell s between a control-gate region of the non-volatile memory cell and a source region of the non-volatile memory cell.

7. The non-volatile memory device of claim 1, wherein the control circuit is configured to delay replacing the operating parameters in the data location with the new operating parameters by a number of erase cycles.

8. The non-volatile memory device of claim 1, wherein the biasing circuit comprises a digital to analog converter.

9. The non-volatile memory device of claim 8, wherein the control circuit provides a digital control signal to the biasing circuit that is received by the digital to analog converter.

10. A non-volatile memory device comprising:
a non-volatile memory cell configured to conduct current in response to application of a threshold voltage; and
a control circuit being configured to control application of an erase voltage to the non-volatile memory cell to reduce the threshold voltage, the erase voltage having a magnitude set by operating parameters stored in a data location, control application of a test voltage to the non-volatile memory cell to determine whether the threshold voltage is less than the test voltage, and replace the operating parameters in the data location with new operating parameters in response to determining that the threshold voltage of the non-volatile memory cell is greater than the test voltage.

11. The non-volatile memory device of claim 10, further comprising the test voltage being less than an erase-verify voltage.

12. The non-volatile memory device of claim 11, wherein the non-volatile memory cell comprises an unwritten state when the threshold voltage is less than the erase-verify voltage.

13. The non-volatile memory device of claim 12, wherein the control circuit is further configured to execute an erase-verify operation to determine whether the threshold voltage of the non-volatile memory cell is less than the erase-verify voltage by directing application of the erase-verify voltage to the non-volatile memory cell.

14. The non-volatile memory device of claim 13, wherein the control circuit is configured to apply an additional erase voltage to the non-volatile memory cell to reduce the threshold voltage in response to determining that the threshold voltage of the non-volatile memory cell is greater than the erase-verify voltage, the additional erase voltage having a magnitude set by the new operating parameters stored in the data location.

15. The non-volatile memory device of claim 10, wherein the control circuit is in communication with a biasing circuit configured to apply voltage to the non-volatile memory cell, and the control circuit is in communication with a sensing circuit configured to sense whether the non-volatile memory cell conducts current.

16. A non-volatile memory device comprising:
- a non-volatile memory cell configured to conduct current in response to application of a threshold voltage, the non-volatile memory cell comprising an unwritten state when the threshold voltage is less than an erase-verify voltage;
- a biasing circuit configured to apply voltage to the non-volatile memory cell, the biasing circuit comprising a digital to analog converter to receive a digital control signal from a control circuit;
- a sensing circuit configured to sense whether the non-volatile memory cell conducts current; and
- the control circuit in communication with the biasing circuit and the sensing circuit, the control circuit being configured to
  - control the biasing circuit to apply an erase voltage to the non-volatile memory cell to reduce the threshold voltage, the erase voltage having a magnitude set by operating parameters stored in a data location,
  - control the biasing circuit to apply a test voltage to the non-volatile memory cell to determine whether the threshold voltage is less than the test voltage, the test voltage being less than the erase-verify voltage;
  - replace the operating parameters in the data location with new operating parameters in response to determining that the threshold voltage of the non-volatile memory cell is greater than the test voltage; and
  - execute an erase-verify operation to determine whether the threshold voltage of the non-volatile memory cell is less than the erase-verify voltage by controlling the biasing circuit to apply the erase-verify voltage to the non-volatile memory cell.

17. The non-volatile memory device of claim 16, wherein the control circuit is configured to apply an additional erase voltage to the non-volatile memory cell to reduce the threshold voltage in response to determining that the threshold voltage of the non-volatile memory cell is greater than the erase-verify voltage, the additional erase voltage having a magnitude set by the new operating parameters stored in the data location.

18. The non-volatile memory device of claim 16, wherein the new operating parameters are incremented from the operating parameters.

19. The non-volatile memory device of claim 16, wherein the non-volatile memory cell comprises a floating gate memory cell.

20. The non-volatile memory device of claim 19, wherein a control voltage is applied to the non-volatile memory cell s between a control-gate region of the non-volatile memory cell and a source region of the non-volatile memory cell.

* * * * *

UNITED STATES PATENT AND TRADEMARK OFFICE
CERTIFICATE OF CORRECTION

PATENT NO. : 11,495,310 B2
APPLICATION NO. : 17/508775
DATED : November 8, 2022
INVENTOR(S) : Giovanni Matranga et al.

It is certified that error appears in the above-identified patent and that said Letters Patent is hereby corrected as shown below:

In the Claims

Claim 6, Column 18, Lines 31-32; delete "cell s between" and insert --cell between--.

Claim 20, Column 20, Lines 31-33; delete "cell s between" and insert --cell between--.

Signed and Sealed this
Twentieth Day of December, 2022

Katherine Kelly Vidal
*Director of the United States Patent and Trademark Office*